United States Patent [19]

Masters

[11] Patent Number: 5,812,072
[45] Date of Patent: Sep. 22, 1998

[54] DATA CONVERSION TECHNIQUE

[76] Inventor: John Masters, 81 Wimbledon Avenue, Narrabeen, New South Wales 2102, Australia

[21] Appl. No.: 776,214

[22] PCT Filed: Jun. 2, 1995

[86] PCT No.: PCT/AU95/00330

§ 371 Date: Mar. 21, 1997

§ 102(e) Date: Mar. 21, 1997

[87] PCT Pub. No.: WO95/34135

PCT Pub. Date: Dec. 14, 1995

[30] Foreign Application Priority Data

Jun. 3, 1994 [AU] Australia .............................. PM 6079

[51] Int. Cl.$^6$ ..................................................... H03M 7/30
[52] U.S. Cl. ................................................ 341/55; 341/80
[58] Field of Search ................................... 341/51, 55, 80

[56] References Cited

U.S. PATENT DOCUMENTS

| | | |
|---|---|---|
| 4,558,302 | 12/1985 | Welch . |
| 4,612,532 | 9/1986 | Bacon et al. . |
| 4,802,110 | 1/1989 | Richards et al. . |
| 4,805,129 | 2/1989 | David . |
| 4,814,746 | 3/1989 | Miller et al. . |
| 5,087,913 | 2/1992 | Eastman . |
| 5,101,446 | 3/1992 | Resnikoff et al. .................. 382/56 |
| 5,150,119 | 9/1992 | Yoshida et al. . |
| 5,153,591 | 10/1992 | Clark . |
| 5,329,279 | 7/1994 | Barbu et al. ........................ 341/50 |

FOREIGN PATENT DOCUMENTS

| | | |
|---|---|---|
| WO91/19271 | 5/1991 | WIPO . |
| WO95/08873 | 8/1994 | WIPO . |
| WO95/34135 | 6/1995 | WIPO . |

*Primary Examiner*—Marc S. Hoff
*Attorney, Agent, or Firm*—Brinks Hofer Gilson & Lione

[57] ABSTRACT

The present invention discloses a mathematical technique which finds substantial utility in electrical engineering, particularly in the general field of data transformation, which occurs in applications such as data encryption and data compression. The technique uses a commencement matrix to transform a first number of a sequence of numbers. This initial transformation forms a forward resultant matrix. Successive transformation of succeeding numbers in the sequence produces for each number in the sequence an augmented forward resultant matrix. Each augmented forward resultant matrix is used to transform the next succeeding number of the sequence, and so on. A final transformed sequence is generated from the final form of the augmented forward resultant matrix.

11 Claims, 3 Drawing Sheets

| | 1 | 2 | 3 | 4 | 5 | 6 | 7 | 8 | 9 | 10 | 11 | 12 |
|---|---|---|---|---|---|---|---|---|---|---|---|---|
| 1 | 1 | 3 | 5 | 9 | 11 | 17 | 21 | 27 | 31 | 41 | 45 | 57 |
| 2 | 2 | * | 8 | * | 16 | * | 26 | * | 40 | * | 56 | |
| 3 | 4 | 7 | * | 15 | 20 | * | 30 | 39 | * | 55 | | |
| 4 | 6 | * | 14 | * | 25 | * | 38 | * | 54 | | | |
| 5 | 10 | 13 | 19 | 24 | * | 37 | 44 | 53 | | | | |
| 6 | 12 | * | * | * | 36 | * | 52 | | | | | |
| 7 | 18 | 23 | 29 | 35 | 43 | 51 | | | | | | |
| 8 | 22 | * | 34 | * | 50 | | | | | | | |
| 9 | 28 | 33 | * | 49 | | | | | | | | |
| 10 | 32 | * | 48 | | | | | | | | | |
| 11 | 42 | 47 | | | | | | | | | | |
| 12 | 46 | | | | | | | | | | | |

2 4 6 22 26 14 8 47 22 22

NOTE: THIS IS CODE 3/9 WHICH IS AUTO-DISCRIMINATING.

DATA CONVERSION TECHNIQUE

The present invention relates to the physical applications to which a new mathematical algorithm can be applied. Such applications include data encryption and decryption, data compression, error correction and like applications which involve a transformation of data and the generation of electric signals.

BACKGROUND ART

Electronic data processing and transmission equipment represents the data to be processed and/or transmitted as a sequence of binary digits in which both the magnitude of the digit (1 or 0) and its position in the sequence are required in order to preserve the necessary information.

OBJECT OF THE INVENTION

The present invention allows that binary data to be transformed whilst still maintaining the information inherent in the binary data. The inverse transformation so as to recover the binary data is also able to be achieved.

SUMMARY OF THE INVENTION

In accordance with the first aspect of the present invention there is disclosed a method of generating a digitally encoded electric output signal representing a transformation of a digitally encoded electric input signal representing a sequence of numbers, said method comprising the steps of:

(i) identifying each said number of said sequence represented in said input signal;

(ii) coupling a first said number of said sequence with a predetermined commencement matrix, said coupling comprising the forward application of a reversible mathematical procedure, to form a forward resultant matrix;

(iii) coupling each succeeding number of said sequence with the forward resultant matrix of the preceding step to form an augmented forward resultant matrix;

(iv) carrying out step (iii) for each remaining number of said sequence in turn to form a final augmented forward resultant matrix; and (v) forming said output signal from the contents of said final augmented forward resultant matrix.

In accordance with a second aspect of the present invention there is disclosed a method of generating a digitally encoded output signal representing a reverse transformation to that described above using as an input the output of the above described method in order to generate an output electric signal which is digitally encoded to represent said sequence of numbers, said method comprising the steps of:

(i) identifying from the output signal of the above described method the contents of said final augmented forward resultant matrix;

(ii) applying in the reverse direction said reversible mathematical procedure to the contents of said final augmented forward resultant matrix to emit a number and form a reverse resultant matrix;

(iii) applying in the reverse direction said reversible mathematical procedure to the contents of said reverse resultant matrix to emit a number and form an augmented reverse resultant matrix;

(iv) carrying out step (iii) for each remaining augmented reverse resultant matrix until said predetermined commencement matrix is generated; and (v) forming said output electric signal by representing said emitted numbers in the sequence of their emission.

In accordance with a third aspect of the present invention there is disclosed a data encryption method comprising the step of carrying out said first method on data comprising said sequence of numbers.

In accordance with a fourth aspect of the present invention there is disclosed a data decryption method comprising the step of carrying out said second method on said encrypted data.

In accordance with a fifth aspect of the present invention there are disclosed methods of data compression and expansion comprising the steps of carrying out said first and second methods respectively.

The above described reversible mathematical forward procedure, and its corresponding reverse procedure set out in parenthesises, includes the following:

(i) addition (subtraction)
(ii) multiplication (division), and
(iii) exponentiation (taking the logarithm).

The predetermined commencement matrix can include the unity matrix and the product of the unity matrix and two.

The final augmented forward matrix can be transposed to emit the sequence in the reverse transformation in the reverse order.

The final augmented matrix can be further transformed by means of a Z transformation, and if necessary repeatedly Z transformed, to arrive at a single number which represents the original sequence of numbers. The sequence can be recovered from this single number.

BRIEF DESCRIPTION OF THE DRAWINGS

Embodiments of the present invention will now be described with reference to the drawings in which.

Figure 1:
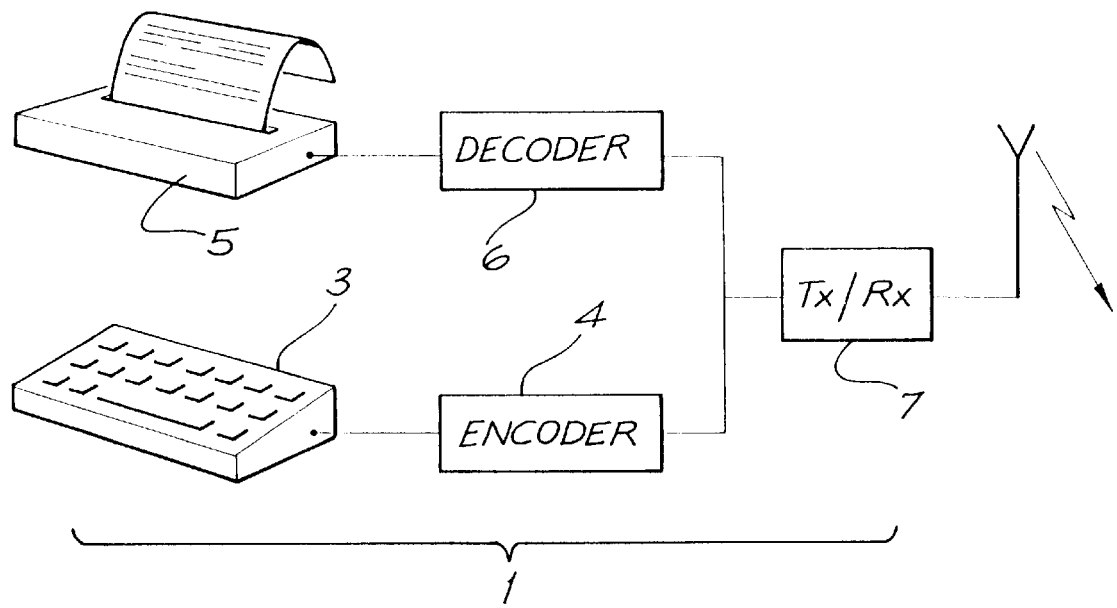
FIG. 1 is a schematic block diagram of a communication system incorporating encryption (encoding) and decryption (decoding) in accordance with one embodiment of the present invention.
Figure 1:
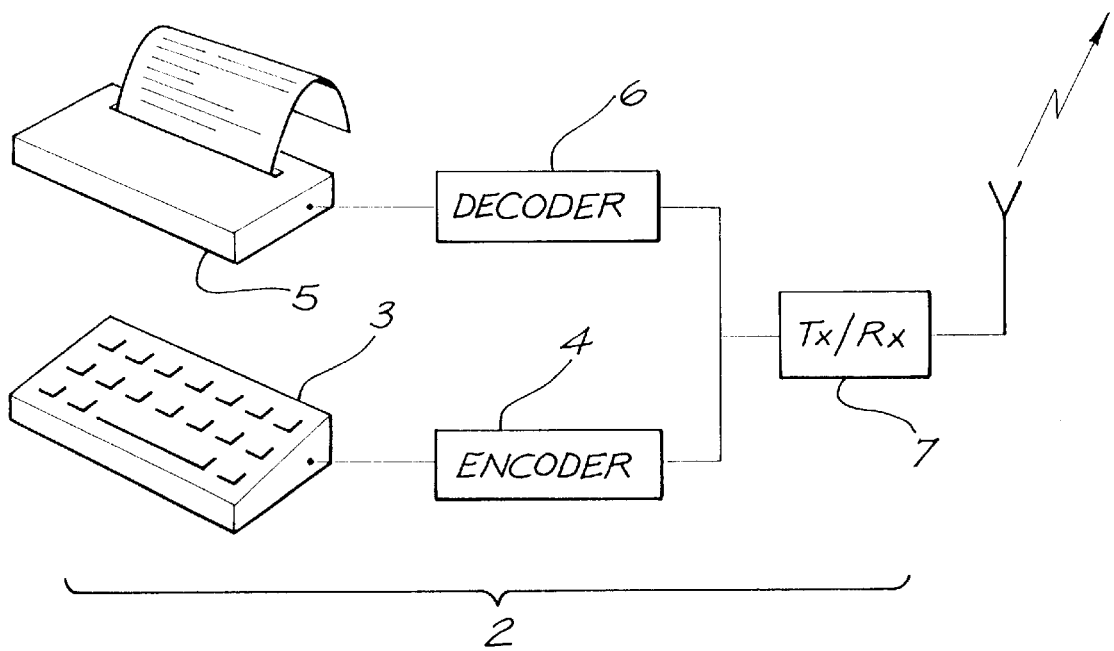

An Appendix to this specification contains a mathematic paper to be published by the inventor which details the mathematical basis underlying the present invention.

DETAILED DESCRIPTION

First Algorithm

In order to provide an initial insight into the algorithm lying behind the present invention, consider the binary sequence 01101 which uses 5 bits to represent the decimal number 13. Each bit of this sequence can now be "coupled" in turn with a matrix. The initial or commencement matrix is the matrix which represents one, unity or the identity matrix, viz:

$$\begin{bmatrix} 1 & 0 \\ 0 & 1 \end{bmatrix}$$

After the initial bit has been "coupled" with the matrix the result is an amended or augmented matrix. Each subsequent bit is then coupled with the augmented matrix resulting from all the previous "couplings".

The "rule" for the coupling is as follows:
(A) If the bit to be "coupled" is a zero, then add the top row of the matrix to the bottom row, placing the result in the bottom row, and leaving the top row unchanged; and
(B) If the bit to be "coupled" is a one, then add the bottom row of the matrix to the top row, placing the result in the top row, and leaving the bottom row unchanged.

Thus, for our example of 01101 the initial bit to be "coupled" is the least significant bit which is 1.

The starting matrix is $$\begin{bmatrix} 1 & 0 \\ 0 & 1 \end{bmatrix}$$

and we add the bottom row to the top as in (B) above giving an augmented forward resultant matrix $$\begin{bmatrix} 1+0 & 0+1 \\ 0 & 1 \end{bmatrix} = \begin{bmatrix} 1 & 1 \\ 0 & 1 \end{bmatrix}$$

The next bit to be coupled is a zero, so we now add the top row to the bottom in accordance with (A) above giving $$\begin{bmatrix} 1 & 1 \\ 0+1 & 1+1 \end{bmatrix} = \begin{bmatrix} 1 & 1 \\ 1 & 2 \end{bmatrix}$$

The next bit is a 1 and so the result is $$\begin{bmatrix} 1+1 & 1+2 \\ 1 & 2 \end{bmatrix} = \begin{bmatrix} 2 & 3 \\ 1 & 2 \end{bmatrix}$$

The next bit to be coupled is also a 1 giving $$\begin{bmatrix} 2+1 & 3+2 \\ 1 & 2 \end{bmatrix} = \begin{bmatrix} 3 & 5 \\ 1 & 2 \end{bmatrix}$$

The last bit to be coupled is a zero giving $$\begin{bmatrix} 3 & 5 \\ 1+3 & 2+5 \end{bmatrix} = \begin{bmatrix} 3 & 5 \\ 4 & 7 \end{bmatrix}$$

So in accordance with the transformation, the binary sequence 01101 can be represented by the final forward augmented matrix $$\begin{bmatrix} 3 & 5 \\ 4 & 7 \end{bmatrix}.$$

In order to reverse the transformation the "rule" to be followed is:
(C) If the sum of the numbers in the bottom row of the matrix is less than the sum of the numbers in the top row of the matrix, "emit" a one, and subtract the bottom row of the matrix from the top row, placing the result in the top row, and leaving the bottom row unchanged; and
(D) If the sum of the numbers in the top row of the matrix is less than the sum of the numbers in the bottom row of the matrix, "emit" a zero, and subtract the top row of the matrix from the bottom row of the matrix, placing the result in the bottom row, and leaving the top row unchanged.

The reverse transformation is completed when the commencement matrix in the form of identity matrix $$\begin{bmatrix} 1 & 0 \\ 0 & 1 \end{bmatrix}$$

is reached.

Thus taking our previous final augmented forward matrix of $$\begin{bmatrix} 3 & 5 \\ 4 & 7 \end{bmatrix}$$

the reverse transformation is as follows:

| START MATRIX | ROW SUM | EMIT | RESULTANT MATRIX | |
|---|---|---|---|---|
| $\begin{bmatrix} 3 & 5 \\ 4 & 7 \end{bmatrix}$ | $\begin{bmatrix} 8 \\ 11 \end{bmatrix}$ | 0 | $\begin{bmatrix} 3 & 5 \\ 4-3 & 7-5 \end{bmatrix}$ | $= \begin{bmatrix} 3 & 5 \\ 1 & 2 \end{bmatrix}$ |
| $\begin{bmatrix} 3 & 5 \\ 1 & 2 \end{bmatrix}$ | $\begin{bmatrix} 8 \\ 3 \end{bmatrix}$ | 1 | $\begin{bmatrix} 3-1 & 5-2 \\ 1 & 2 \end{bmatrix}$ | $= \begin{bmatrix} 2 & 3 \\ 1 & 2 \end{bmatrix}$ |
| $\begin{bmatrix} 2 & 3 \\ 1 & 2 \end{bmatrix}$ | $\begin{bmatrix} 5 \\ 3 \end{bmatrix}$ | 1 | $\begin{bmatrix} 2-1 & 3-2 \\ 1 & 2 \end{bmatrix}$ | $= \begin{bmatrix} 1 & 1 \\ 1 & 2 \end{bmatrix}$ |
| $\begin{bmatrix} 1 & 1 \\ 1 & 2 \end{bmatrix}$ | $\begin{bmatrix} 2 \\ 3 \end{bmatrix}$ | 0 | $\begin{bmatrix} 1 & 1 \\ 1-1 & 2-1 \end{bmatrix}$ | $= \begin{bmatrix} 1 & 1 \\ 0 & 1 \end{bmatrix}$ |
| $\begin{bmatrix} 1 & 1 \\ 0 & 1 \end{bmatrix}$ | $\begin{bmatrix} 2 \\ 1 \end{bmatrix}$ | 1 | $\begin{bmatrix} 1-0 & 1-1 \\ 0 & 1 \end{bmatrix}$ | $= \begin{bmatrix} 1 & 0 \\ 0 & 1 \end{bmatrix}$ |

It will be seen that the emitted sequence is 10110 which is actually the reverse of the initial sequence. Emitting the "most significant bit" of the sequence first can have significant engineering advantages in storing digits in shift registers, however, this "reverse sequence" need not be obtained.

The sequence can be obtained in the correct order by the simple expedient of transposing the initial starting matrix (ie. the result of the original transformation).

Thus the matrix $$\begin{bmatrix} 3 & 5 \\ 4 & 7 \end{bmatrix}$$

transposes to $$\begin{bmatrix} 7 & 5 \\ 4 & 3 \end{bmatrix}.$$

If the latter matrix is used as the starting point in the reverse transformation, the result is as follows:

| START MATRIX | ROW SUM | EMIT | RESULTANT MATRIX | |
|---|---|---|---|---|
| $\begin{bmatrix} 7 & 5 \\ 4 & 3 \end{bmatrix}$ | $\begin{bmatrix} 12 \\ 7 \end{bmatrix}$ | 1 | $\begin{bmatrix} 7-4 & 5-3 \\ 4 & 3 \end{bmatrix}$ | $= \begin{bmatrix} 3 & 2 \\ 4 & 3 \end{bmatrix}$ |
| $\begin{bmatrix} 3 & 2 \\ 4 & 3 \end{bmatrix}$ | $\begin{bmatrix} 5 \\ 7 \end{bmatrix}$ | 0 | $\begin{bmatrix} 3 & 2 \\ 4-3 & 3-2 \end{bmatrix}$ | $= \begin{bmatrix} 3 & 2 \\ 1 & 1 \end{bmatrix}$ |
| $\begin{bmatrix} 3 & 2 \\ 1 & 1 \end{bmatrix}$ | $\begin{bmatrix} 5 \\ 2 \end{bmatrix}$ | 1 | $\begin{bmatrix} 3-1 & 2-1 \\ 1 & 1 \end{bmatrix}$ | $= \begin{bmatrix} 2 & 1 \\ 1 & 1 \end{bmatrix}$ |
| $\begin{bmatrix} 2 & 1 \\ 1 & 1 \end{bmatrix}$ | $\begin{bmatrix} 3 \\ 2 \end{bmatrix}$ | 1 | $\begin{bmatrix} 2-1 & 1-1 \\ 1 & 1 \end{bmatrix}$ | $= \begin{bmatrix} 1 & 0 \\ 1 & 1 \end{bmatrix}$ |

-continued

| START MATRIX | ROW SUM | EMIT | RESULTANT MATRIX |
|---|---|---|---|
| $\begin{bmatrix} 1 & 0 \\ 1 & 1 \end{bmatrix}$ | $\begin{bmatrix} 1 \\ 2 \end{bmatrix}$ | 0 | $\begin{bmatrix} 1 & 0 \\ 1-1 & 1-0 \end{bmatrix} = \begin{bmatrix} 1 & 0 \\ 0 & 1 \end{bmatrix}$ |

It will be seen that the correct sequence is emitted 01101 with the "least significant bit" emitted first.

Manipulation of even lengthy sequences of binary data will lead to the observation that the only numbers generated within the matrix are relative prime numbers (ie. they have no common factors other than 1).

Having appreciated the transformation of the binary sequence 01101 into the matrix $$\begin{bmatrix} 3 & 5 \\ 4 & 7 \end{bmatrix},$$

it will be further appreciated that the transformation need not stop there.

In particular, for a matrix the product of the determinants equals the determinant of the product. Thus, for the matrix $$\begin{bmatrix} a & b \\ c & d \end{bmatrix},$$

the following holds (ad−bc)=1
  that is a=(bc+1)/d. (RULE E)

Similar expressions can be generated for each of b, c and d in terms of the other three numbers.

The first consequence of this result is that in order to store the resultant matrix it is necessary to store only 3 numbers, not 4. That is, the binary sequence 01101 which represents 13 in decimal can also be represented by the numbers 3, 5, 4 and 7 (order being important) or any three of those numbers (again order being important in the representation).

It will be apparent to those skilled in the art that in binary form a large number of variables (bits) having a limited range of values (0 or 1) can be used to represent information. However, in accordance with the present invention this information can be represented by a very small number of variables (eg. 4, 3 or even less as will be explained hereafter) each of which can have a value with a very large range of values. That is, the 5 bits of binary data can be stored as 3 or 4 numbers, however, as the number of bits increases the number of numbers used to represent the binary data does not increase. Instead, only the magnitude of these representative numbers increases.

With the above described embodiment of the algorithm of the present invention, a number of practical applications will now be described.

The first such practical application is that of data encryption and decryption. As schematically indicated in FIG. 1, a data transmission system at each of the "ends" 1 and 2 of the system takes the form of a keyboard 3 connected to an encoder 4 and a printer 5 connected to a decoder 6. Both the encoder 4 and decoder 6 are connected to a transceiver 7 which can transmit to, and receive from, a like transceiver 7. Although the transmission is schematically indicated as being a radio broadcast, transmission by wire is also possible. The encoders 4 and decoders 6, operate in accordance with the rules A, B, C and D as described above. The output of the keyboard 3 is in binary ASCII code, is converted into 4 decimal digits (or 3 if the above described storage reduction is utilized), which can then be converted into binary form for transmission. The process is reversed following reception which allows the data originally input into the keyboard 3 of, say, station 1, to be output by the printer 5 of station 2.

It will be apparent to those skilled in the art that the logic circuits necessary to create the encoders 4 and decoders 6 are quite straightforward and need not be described in any detail.

A second application which arises out of the first application is the generation and manipulation of digitally encoded electric waveforms. As seen in FIG. 1, an encoder 14 which operates in accordance with rules A and B given above is able to receive as an input a digitally encoded electric signal which represents the binary number 01101 (13 in decimal) and output four digitally encoded electric signals which respectively represent the numbers 011 (3 in decimal), 101 (5 in decimal), 100 (4 in decimal), and 111 (7 in decimal). These four signals can be output either in parallel form (as schematically indicated in FIG. 2) or in serial form.

Figure 2:
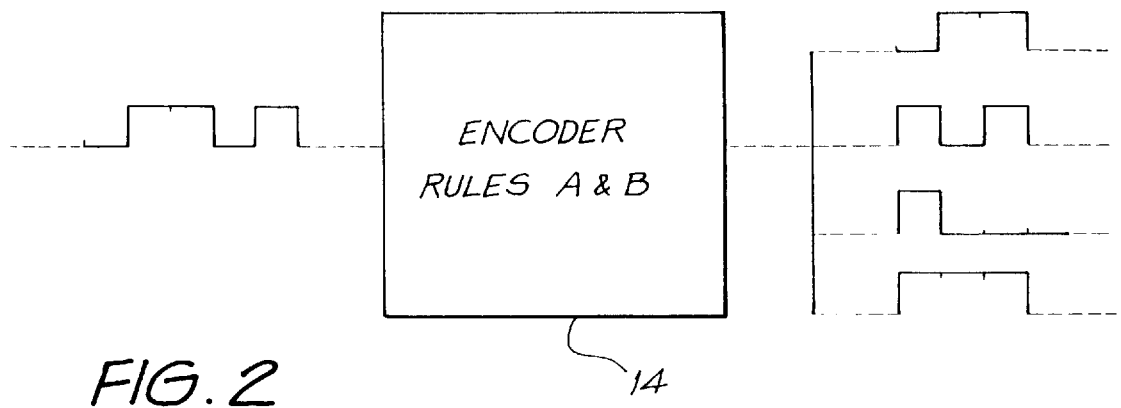
FIGS. 2–4 are schematic block diagrams of encoding and decoding arrangements for generating output electric signals from input electric signals.
Figure 3:
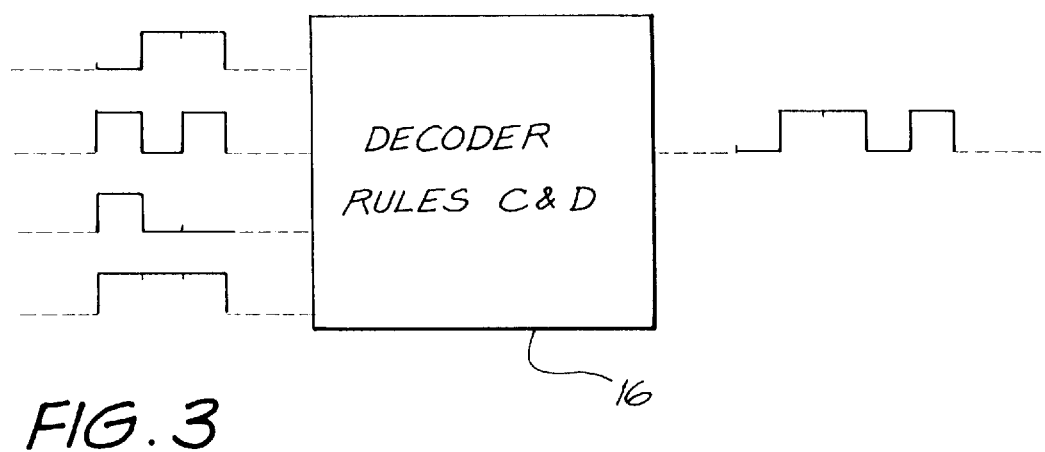

FIG. 3 illustrates the reverse process. Here a decoder 16 which operates in accordance with rules C and D above, receives as input the four signals generated by the encoder 14 of FIG. 2. Again the signals can be input either in parallel or series form. The output of generator 16 is the input signal applied to encoder 14 which represents the binary number 01101 (13 in decimal).

Figure 4:
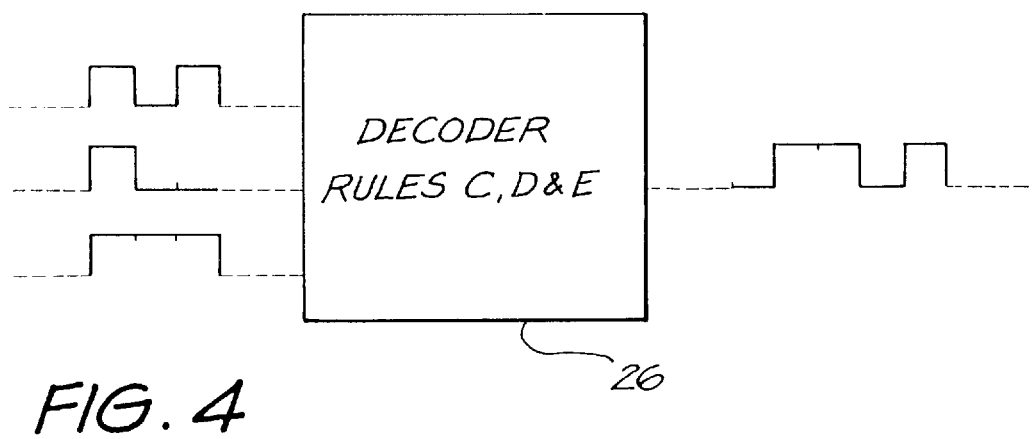

Further, as indicated in FIG. 4, by use of a decoder 26 which operates in accordance with rules C, D and E above, then the desired output signal can be generated from only three input signals since the "missing" fourth input can be internally generated in accordance with rule E.

It will be apparent to those skilled in the art that the actual waveforms illustrated in FIGS. 2–4 include small pips which are illustrated only for the purpose of making it easier for the reader to distinguish the start and end of each bit of the waveform. Again the internal logic circuitry of the encoder 14 and decoders 16, 26 is quite straightforward. In this connection, see any undergraduate electrical engineering text such as:

"Digital Computer Fundamentals", Thomas C. Bartee, Published by McGraw-Hill Book Company;
  "Logic Design with Integrated Circuits", William E Wickes, Published by John Wiley & Sons, Inc.
  "Introduction to Switching Theory and Logical Design", Frederick J. Hill, Ph.D., Gerald R Peterson, Ph.D., Published by John Wiley & Sons, Inc.
  "Automata and Languages", John M Howie 1991, Clarendon Press, Oxford Science Publication.

A third practical application is data compression. In the example indicated above, the digital number 13 represented by 01101 occupies 13 bits and can be represented by the digital numbers 3, 5, 4, 7 which respectively occupy 2, 3, 2 and 3 bits making a total of 10 bits in all. This would be reduced to three numbers 5, 4, 7 utilizing the above described reduced storage which would require 8 bits. The fourth number (3) is given by 3=(4×5+1)/7.

However, if storage other than conventional binary data storage is considered, then a large amount of binary data can be stored very simply. For example, consider four rows of numbers each containing only relative prime numbers and each corresponding to one of the four numbers of the matrix. A marker is moved to the location corresponding to value of the corresponding number in the matrix. Thus an arrangement similar to two billiards scorers can store a long binary sequence. Again a further compression is available by storing only 3 of the numbers and calculating the fourth therefrom.

A fourth such practical application is error detection/correction. Firstly, the reverse transformation can be checked for errors by reverse transforming the "received matrix" and reversing the decoded sequence order. The resulting sequence is then compared with the result of transposing the "received matrix" and then reverse transforming. If the comparison does not reveal two identical sequences, then an error in the reverse transformation has been detected. It is then necessary for the calculation to be repeated until the correct result is obtained.

Secondly, and of more importance, is error correction of the transmitted data. For example, the matrix $$\begin{bmatrix} 3 & 5 \\ 4 & 7 \end{bmatrix}$$

is reduced to just the three numerals 5, 4 and 7 and transmitted along with the three numerals 5, 4, and 3 derived from the transposed matrix $$\begin{bmatrix} 7 & 5 \\ 4 & 3 \end{bmatrix}.$$

At the receiving end two matrices are generated from the six received numbers.

If the 7 of the first transmitted matrix has been received as a 6, for example, this error can be immediately detected since the received number is not a relative prime. Thus the other received matrix is presumed to be correct.

Similarly, if the 7 of the first transmitted matrix has been received as a 5, for example, then the re-constituted matrices become $$\begin{bmatrix} a & 5 \\ 4 & 5 \end{bmatrix} \text{ and } \begin{bmatrix} A & 5 \\ 4 & 3 \end{bmatrix}.$$

where a=(5×4+1)/5=(20+1)/5 which does not give a relative prime and must therefore be wrong, whilst $$A=(5\times 4\ 1)/3=(20+1)/3=21/3=7$$

which is a relative prime and is therefore presumed to be correct.

Still further, if the 7 of the first transmitted matrix had been received as a 1, then the reconstituted first matrix would be $$\begin{bmatrix} a & 5 \\ 4 & 1 \end{bmatrix}$$

where a=(5×4+1)/1=21

However, here clearly the first and second received and reconstituted matrices $$\begin{bmatrix} 21 & 5 \\ 4 & 1 \end{bmatrix} \text{ and } \begin{bmatrix} 7 & 5 \\ 4 & 3 \end{bmatrix}$$

are not transposes of each other and so there must be an error.

This error can be corrected, and the corrected matrix identified in accordance with the following:

The received matrix can be regarded as the matrix $$\begin{bmatrix} x & 5 \\ 4 & y \end{bmatrix}$$

where x and y are unknowns. However, each entry in the matrix must be an integer. Furthermore, the cross product of the matrix entries must differ by one. That is 4×5=20 and so x·y=20+1=21. The factors of 21 and 1, 3, 7 and 21 and in general the number of possible factors will be small being less than one half of the square root of the product.

Thus these four integers 1, 3, 5 and 21 are candidates for x and y. Therefore possible matrices are the pair $$\begin{bmatrix} 21 & 5 \\ 4 & 1 \end{bmatrix} \text{ and } \begin{bmatrix} 1 & 5 \\ 4 & 21 \end{bmatrix}$$

and the pair $$\begin{bmatrix} 7 & 5 \\ 4 & 3 \end{bmatrix} \text{ and } \begin{bmatrix} 3 & 5 \\ 4 & 7 \end{bmatrix}.$$

Of these four the first pair can be "eliminated" since on being decoded they each yield a sequence of nine binary digits whereas the second pair on being decoded each yield a sequence with the "correct" number of binary digits, namely five. In this connection, the correct number of digits in the sequence is generally known, for example as a result of organisation of transmitted data into "packets" of known length.

The error correction properties of the four numbers of encoding matrices are based on the fact that each relative prime pair of numbers contained carries almost as much information as the full matrix. A valid matrix $$\begin{bmatrix} a & b \\ c & d \end{bmatrix}$$

contains relative prime pairs
a,c
b,d
d,c
b,a.

Each pair can be decoded in such a way that at most only leading or trailing repeated binary digits need to be estimated. The method of decoding these pairs differs only in (a) the rule for terminating the process, and (b) the interpretation to be given when both variables have the value 1.

(a) The termination condition for each pair can be found from the initial settings for encoding in which a=1, b=0, c=0 and d=1. Decoding of the pair a,c for example terminates when a=1 and c=0.

(b) In order to terminate when one variable becomes 0, the decoding process must be such that both variables equal 1 at the step before. The interpretation to be given can be deduced by reference to the encoding process for the pair in question. Initially a=1 and c=0. If a one is encoded first, a is set to a+c. Since c is zero no change occurs to a regardless of the number of leading ones encoded. When the first zero is encoded c is set to a+c=1+0=1 and thus a remains 1. Hence in decoding a,c the point (or position in the sequence) at which a=1 and c=1 is decoded as zero. It is also recognised that this zero may have been preceded by any number of ones including none.

As previously described the sequence 01101 when encoded in the order least significant bit to most significant bit results in the matrix $$\begin{bmatrix} 3 & 5 \\ 4 & 7 \end{bmatrix}$$

so that a=3, b=5, c=4 and d=7.

For the pair a,c decoding now takes the form:

| START MATRIX | WHICH ROW LARGER OR ROWS EQUAL | EMIT | RESULTANT MATRIX |
|---|---|---|---|
| $\begin{bmatrix} 3 \\ 4 \end{bmatrix}$ | L | 0 | $\begin{bmatrix} 3 \\ 1 \end{bmatrix}$ |
| $\begin{bmatrix} 3 \\ 1 \end{bmatrix}$ | U | 1 | $\begin{bmatrix} 2 \\ 1 \end{bmatrix}$ |
| $\begin{bmatrix} 2 \\ 1 \end{bmatrix}$ | U | 1 | $\begin{bmatrix} 1 \\ 1 \end{bmatrix}$ |
| $\begin{bmatrix} 1 \\ 1 \end{bmatrix}$ | E | 0 | $\begin{bmatrix} 1 \\ 0 \end{bmatrix}$ |
| $\begin{bmatrix} 1 \\ 0 \end{bmatrix}$ | U | END or any number of 1's | $\begin{bmatrix} 1 \\ 0 \end{bmatrix}$ |

On the same principles the pair b,d terminates when b=0 and d=1 and ignores leading zeros, equality is decoded as a one.

| START MATRIX | WHICH ROW LARGER OR ROWS EQUAL | EMIT | RESULTANT MATRIX |
|---|---|---|---|
| $\begin{bmatrix} 5 \\ 7 \end{bmatrix}$ | L | 0 | $\begin{bmatrix} 5 \\ 2 \end{bmatrix}$ |
| $\begin{bmatrix} 5 \\ 2 \end{bmatrix}$ | U | 1 | $\begin{bmatrix} 3 \\ 2 \end{bmatrix}$ |
| $\begin{bmatrix} 3 \\ 2 \end{bmatrix}$ | U | 1 | $\begin{bmatrix} 1 \\ 2 \end{bmatrix}$ |
| $\begin{bmatrix} 1 \\ 2 \end{bmatrix}$ | L | 0 | $\begin{bmatrix} 1 \\ 1 \end{bmatrix}$ |
| $\begin{bmatrix} 1 \\ 1 \end{bmatrix}$ | E | 0 | $\begin{bmatrix} 0 \\ 1 \end{bmatrix}$ |
| $\begin{bmatrix} 0 \\ 1 \end{bmatrix}$ | L | END or any number of 0's | $\begin{bmatrix} 0 \\ 1 \end{bmatrix}$ |

The pair d,c decodes in the same order as encoding, that is the least significant bit first. Initially, a=1 and c=0 and equality occurs for the first zero.

| START MATRIX | WHICH ROW LARGER OR ROWS EQUAL | EMIT | RESULTANT MATRIX |
|---|---|---|---|
| $\begin{bmatrix} 7 \\ 4 \end{bmatrix}$ | U | 1 | $\begin{bmatrix} 3 \\ 4 \end{bmatrix}$ |
| $\begin{bmatrix} 3 \\ 4 \end{bmatrix}$ | L | 0 | $\begin{bmatrix} 3 \\ 1 \end{bmatrix}$ |
| $\begin{bmatrix} 3 \\ 1 \end{bmatrix}$ | U | 1 | $\begin{bmatrix} 2 \\ 1 \end{bmatrix}$ |
| $\begin{bmatrix} 2 \\ 1 \end{bmatrix}$ | U | 1 | $\begin{bmatrix} 1 \\ 1 \end{bmatrix}$ |
| $\begin{bmatrix} 1 \\ 1 \end{bmatrix}$ | E | 0 | $\begin{bmatrix} 1 \\ 0 \end{bmatrix}$ |
| $\begin{bmatrix} 1 \\ 0 \end{bmatrix}$ | U | END or any number of 1's | $\begin{bmatrix} 1 \\ 0 \end{bmatrix}$ |

The pair b,a also decodes in the same order as encoding. The halting rule is b=0, a=1 and equality occurs for the first 1 and leading 0's are ignored.

| START MATRIX | WHICH ROW LARGER OR ROWS EQUAL | EMIT | RESULTANT MATRIX |
|---|---|---|---|
| $\begin{bmatrix} 5 \\ 3 \end{bmatrix}$ | U | 1 | $\begin{bmatrix} 2 \\ 3 \end{bmatrix}$ |
| $\begin{bmatrix} 2 \\ 3 \end{bmatrix}$ | L | 0 | $\begin{bmatrix} 2 \\ 1 \end{bmatrix}$ |
| $\begin{bmatrix} 2 \\ 1 \end{bmatrix}$ | U | 1 | $\begin{bmatrix} 1 \\ 1 \end{bmatrix}$ |
| $\begin{bmatrix} 1 \\ 1 \end{bmatrix}$ | E | 1 | $\begin{bmatrix} 0 \\ 1 \end{bmatrix}$ |
| $\begin{bmatrix} 0 \\ 1 \end{bmatrix}$ | L | END or any number of 0's | $\begin{bmatrix} 0 \\ 1 \end{bmatrix}$ |

The following table summarises the decodings from the four pairs for comparison. Underlining indicates the bits that are not in doubt in each case.

| PAIR | DECODED SEQUENCE |
|---|---|
| a, c | 01101111 ... |
| b, d | 01101000 ... |
| d, c | ... 111101101 |
| b, a | ... 000001101 |

These entries can be interpreted as follows:

For a,c the encoded sequence, read from left to right began 0110. If there were other digits they were all ones.

For b,c the encoded sequence read from left to right began 01101. If there were other digits they were all zeros.

For d,c the encoded sequence read right to left was 10110. If there were other digits they were all ones.

For b,a the encoded sequence read from right to left began 1011. If there were other digits they were all zeros.

It is evidence that any two pairs can be used to settle the correct encoding. If the pairs a,c and d,c or the pairs b,d and b,a are chosen then only three of the four numbers available are involved in deciding the correct decoding. Moreover, if as is generally the case, information about the length of the encoded sequence is available to the "receiver", any single pair of numbers provide a complete decoding.

As a consequence of the above, a further method of length dependent encoding (ie. where both the sender and receiver both know the length of the sequence being transmitted, say 256 bits, but the receiver does not know the content) is available.

In this method, if both the $$\begin{bmatrix} 0 \\ 1 \end{bmatrix} \text{ and } \begin{bmatrix} 1 \\ 0 \end{bmatrix}$$

matrices are each separately used as the start matrix, then leading zeros and ones respectively are ignored. This results in two decoded results which can be matched to correct any error.

The "rule" for this length dependent encoding (with x and y being the working values) is as follows:

Step 1 Set x=0, y=1
Step 2 If the input bit is zero set y=y+x
   If the input bit is one set x=y+x
Step 3 If the last input bit has been reached, emit the present values of x and y and then end, otherwise go to step 1 and repeat for the next bit.

Similarly, the "rule" for decoding is as follows:

Step 1 Set i equal to the length of the sequence (eg. i=156)
Step 2 If x≧y emit 1 and set x=x−y
   If x<y emit 0 and set y=y−x
Step 3 Set i=i−1,
   if i is now 0 then halt, otherwise go to step 2/

If the initial setting is x=1 and y=0 then equality is interpreted as "emit 0".

Further error correction can be obtained by consideration of the parity of the matrix entries.

Random sampling from valid 2×2 matrices with three numbers recorded and say the bottom right entry to be reconstructed is from a population in which the other entries have expected values that have odd parity twice as often as they have even parity. This type of probability information enhances error detection and correction and is independent of the length of encoded sequences. There are 16 possible arrangements of odd and even entries for 2×2 matrices, only six of these can occur in a valid matrix. The full parity restrictions are indicated in the following table for valid matrices $$\begin{bmatrix} a & b \\ c & d \end{bmatrix}.$$

| Parity | | | | | |
|---|---|---|---|---|---|
| a | b | c | d | Example | |
| O | O | O | E | $\begin{bmatrix} 1 & 1 \\ 3 & 4 \end{bmatrix}$ | 1 |
| O | O | E | O | $\begin{bmatrix} 1 & 1 \\ 2 & 3 \end{bmatrix}$ | 2 |
| O | E | O | O | $\begin{bmatrix} 1 & 2 \\ 1 & 3 \end{bmatrix}$ | 3 |
| O | E | E | O | $\begin{bmatrix} 1 & 2 \\ 2 & 5 \end{bmatrix}$ | 4 |
| E | O | O | E | $\begin{bmatrix} 2 & 3 \\ 1 & 2 \end{bmatrix}$ | 5 |
| E | O | O | O | $\begin{bmatrix} 2 & 4 \\ 1 & 3 \end{bmatrix}$ | 6 |

O = ODD
E = EVEN

Thus if the equivalent parity of the received matrix is calculated, if the parity does not fall within this class, there must be an error.

Further the most likely error is alteration of a single bit, and thus the most likely number is the number to either side of the incorrect received number.

Thus, if the received matrix is $$\begin{bmatrix} 3 & 5 \\ 1 & 3 \end{bmatrix}$$

then the parity is O O O which is "all odd" and does not occur in the table above. Hence, there is an error. The most likely correction is a single parity change. If a single change is required the possible candidates are the matrices corresponding to lines, 1, 2 3 and 6 of the above table.

Second Algorithm

The algorithm of the present invention is not confined to the above example. In a second example a column matrix or vector in the form $$\begin{bmatrix} n \\ n \end{bmatrix}$$

is used for the encoding with the following rules:

(1) If the bit to be encoded is a zero, add the two numbers in the matrix to each other, leaving the upper number as it is, and replacing the lower number with the sum, and (2) If the list to be encoded is a one, add the two numbers in the matrix to each other, leaving the lower number as it is, and replacing the upper number with the sum. Again the starting matrix is the unity matrix $$\begin{bmatrix} 1 \\ 1 \end{bmatrix}.$$

Thus to encode the sequence 0101 gives $$1 \quad \begin{bmatrix} 1 \\ 1 \end{bmatrix} = \begin{bmatrix} 1+1 \\ 1 \end{bmatrix} = \begin{bmatrix} 2 \\ 1 \end{bmatrix}$$

$$0 \quad \begin{bmatrix} 2 \\ 1 \end{bmatrix} = \begin{bmatrix} 2 \\ 1+2 \end{bmatrix} = \begin{bmatrix} 2 \\ 3 \end{bmatrix}$$

$$1 \quad \begin{bmatrix} 2 \\ 3 \end{bmatrix} = \begin{bmatrix} 2+3 \\ 3 \end{bmatrix} = \begin{bmatrix} 5 \\ 3 \end{bmatrix}$$

$$0 \quad \begin{bmatrix} 5 \\ 3 \end{bmatrix} = \begin{bmatrix} 5 \\ 3+5 \end{bmatrix} = \begin{bmatrix} 5 \\ 8 \end{bmatrix}$$

Thus the sequence 0101 is represented by the matrix or vector (5,8). This represents a unique mapping of the sequence into a two dimensional space. Further, an arbitrarily long binary sequence can be represented by two numbers of arbitrary magnitude, again order being important in the representation.

To decode, the rule can be expressed as follows:

(3) If the upper number is larger than the lower number, "emit" a one and replace the upper number with the difference of the two numbers whilst leaving the lower number as is, and (4) If the lower number is larger than the upper number, "emit" a zero and replace the lower number with the difference of the two numbers whilst leaving the upper number as is.

The decoding ceases when the unitary matrix $$\begin{bmatrix} 1 \\ 1 \end{bmatrix}$$

is reached.

To decode the above example,

| START MATRIX | LARGER | EMIT | RESULTANT MATRIX |
|---|---|---|---|
| $\begin{bmatrix} 5 \\ 8 \end{bmatrix}$ | L | 0 | $\begin{bmatrix} 5 \\ 8/5 \end{bmatrix} = \begin{bmatrix} 5 \\ 3 \end{bmatrix}$ |
| $\begin{bmatrix} 5 \\ 3 \end{bmatrix}$ | U | 1 | $\begin{bmatrix} 5/3 \\ 3 \end{bmatrix} = \begin{bmatrix} 2 \\ 3 \end{bmatrix}$ |
| $\begin{bmatrix} 2 \\ 3 \end{bmatrix}$ | L | 0 | $\begin{bmatrix} 2 \\ 3/2 \end{bmatrix} = \begin{bmatrix} 2 \\ 1 \end{bmatrix}$ |
| $\begin{bmatrix} 2 \\ 1 \end{bmatrix}$ | U | 1 | $\begin{bmatrix} 2/1 \\ 1 \end{bmatrix} = \begin{bmatrix} 1 \\ 1 \end{bmatrix}$ |

Again, the decoded sequence is "emitted" in reverse order.

Third Algorithm

In a third example, it is not necessary to use addition, another binary operation such as multiplication can suffice. If a column matrix or vector in the form of $$\begin{bmatrix} n \\ n \end{bmatrix}$$

is again used, then the following encoding rules can apply:
  (a) If the bit to be encoded is a zero, multiply the two numbers together, leaving the upper number unchanged, and replacing the lower number with the product, and
  (b) If the bit to be encoded is a one, multiply the two numbers together, leaving the lower number unchanged, and replacing the upper number with the product. Since 1×1=1, and thus 1 will not give a product different from itself when multiplied by itself, the starting matrix is $$\begin{bmatrix} 2 \\ 2 \end{bmatrix}.$$

Thus to encode the sequence 0101 gives $$1 \begin{bmatrix} 2 \\ 2 \end{bmatrix} = \begin{bmatrix} 2 \times 2 \\ 2 \end{bmatrix} = \begin{bmatrix} 4 \\ 2 \end{bmatrix}$$

$$0 \begin{bmatrix} 4 \\ 2 \end{bmatrix} = \begin{bmatrix} 4 \\ 2 \times 4 \end{bmatrix} = \begin{bmatrix} 4 \\ 8 \end{bmatrix}$$

$$1 \begin{bmatrix} 4 \\ 8 \end{bmatrix} = \begin{bmatrix} 4 \times 8 \\ 8 \end{bmatrix} = \begin{bmatrix} 32 \\ 8 \end{bmatrix}$$

$$0 \begin{bmatrix} 32 \\ 8 \end{bmatrix} = \begin{bmatrix} 32 \\ 8 \times 32 \end{bmatrix} = \begin{bmatrix} 32 \\ 256 \end{bmatrix}$$

Thus the sequence 0101 is represented by the matrix or vector (32,256). This again represents a unique mapping of the sequence into a two dimensional space. It will be observed that taking the logarithm to base 2 of the vector of this example (at any stage) results in the vector of the previous example. That is $\log_2 32 = 5$ and $\log_2 256 = 8$.

In order to decode, the rule can be expressed as follows:
  (c) If the upper number is larger than the lower number, "emit" a one and divide the smaller number into the larger number, leaving the smaller number unchanged, and replacing the larger number with the result of the division, and
  (d) If the lower number is larger than the upper number, "emit" a zero and divide the smaller number into the larger number, leaving the smaller number unchanged and replacing the larger number with the result of the division. The decoding ceases when the starting matrix $$\begin{bmatrix} 2 \\ 2 \end{bmatrix}$$

is reached.

To decode the above example

| START MATRIX | LARGER NO. | EMIT | RESULTANT MATRIX |
|---|---|---|---|
| $\begin{bmatrix} 32 \\ 256 \end{bmatrix}$ | L | 0 | $\begin{bmatrix} 32 \\ 256/32 \end{bmatrix} = \begin{bmatrix} 32 \\ 8 \end{bmatrix}$ |
| $\begin{bmatrix} 32 \\ 8 \end{bmatrix}$ | U | 1 | $\begin{bmatrix} 32/8 \\ 8 \end{bmatrix} = \begin{bmatrix} 4 \\ 8 \end{bmatrix}$ |
| $\begin{bmatrix} 4 \\ 8 \end{bmatrix}$ | L | 0 | $\begin{bmatrix} 4 \\ 8/4 \end{bmatrix} = \begin{bmatrix} 4 \\ 2 \end{bmatrix}$ |
| $\begin{bmatrix} 4 \\ 2 \end{bmatrix}$ | U | 1 | $\begin{bmatrix} 4/2 \\ 2 \end{bmatrix} = \begin{bmatrix} 2 \\ 2 \end{bmatrix}$ |

The above examples result in the original information bearing sequence being compressed by being mapped uniquely into a two dimensional space. The mapping is such that error detection and/or correction is possible since the vector components (ie. the two numbers) must be relative primes.

Any sequence of positive whole numbers can be similarly faithfully encoded and decoded. The modified statement of the algorithm to accept a sequence of nonzero positive integers $n_1, n_2 \ldots n_i \ldots$, indexed by i is as follows:

Step 1. Set a 2×2 matrix $$\begin{bmatrix} a & b \\ c & d \end{bmatrix}$$

to the values of the identity matrix.

$$\text{ie. } \begin{bmatrix} 1 & 0 \\ 1 & 0 \end{bmatrix}$$

Step 2. If i is odd then
  Set $a = a + (n_i \times c)$
  Set $b = b + (n_i \times d)$
  If i is even then
  Set $c = c + (n_i \times a)$
  Set $d = c + (n_i \times d)$
Step 3. If the last input is reached emit the present values of a, b, c, d otherwise goto Step 2 and repeat for the next number.
If it is required to decode in the original order then
  Set $x = b + c$
  Set $y = a + c$.
If it is required to decode in reverse order then
  Set $x = a + b$
  Set $y = c = d$.

To decode

Step 1. Accept x and y

Step 2. If x>y then determine the least number n such that
x−(n×y) is less than or equal to y
Emit n.

If y>x then determine the least number n such that
y−(n×y) is less than or equal to x
Emit n.

If x=y then END goto Step 1.

If it is only required to decode in reverse order the matrix of the encoding procedure need only be the 2×1 matrix $$\begin{bmatrix} a \\ c \end{bmatrix}$$

initially set as $$\begin{bmatrix} 1 \\ 1 \end{bmatrix}.$$

The encoding algorithm given above is then followed save that references to b or d are ignored.

Data Compression

However, if this capability is prepared to be lost, a still further compression is available by means of what is conveniently referred to as a Z transformation. In this connection, reference is made to the table of FIG. 5 which is able to be conveniently stored in the form of a ROM or look-up table in modern digital processing equipment.

Figures 5, 6:
FIG. 5 is a Table illustrating a still further data compressing transformation.
FIG. 6 is a bar code representing an encoded sequence which in turn represents the letters DO NOT INCINERATE.

The table of FIG. 5 is formed as a number of rows and columns. At the start of each row is an integer (which conveniently represents the first of the two vector components) and at the head of each column is an integer (which conveniently represents the second of the two vector components). Thus each entry in the table is a potential representation of the two dimensional space into which the sequence is mapped.

However, since the numbers of the two dimensional space must be relative primes, it is not possible for a sequence to be mapped into some entries in the table such as (2,4) (6,2) and in general (n,m) where both n and m are divisible by a factor greater than one. These entries are therefore marked with an asterisk *. The remaining entries are then numbered 1, 2, 3 ... and so on, so that the vector components (5,2) are represented by the number 13 whilst the vector components (4,5) are represented by the number 25, etc. It is thought from number theory that the remaining entries constitute about 61.803% of the total number of squares. That is about 40% of the squares will carry asterisks.

Using the table of FIG. 5, it will be seen that the abovementioned sequence 0101 which can be represented as (5,8) can be further compressed and represented by the single number 53.

In addition, this Z transformation can be undertaken repeatedly. So to return to the first example of the sequence 01101, the matrix $$\begin{bmatrix} 3 & 5 \\ 4 & 7 \end{bmatrix}$$

can be regarded as two pairs of numbers, say, (3,5) and (4,7). If each of these pairs is Z transformed according to the table of FIG. 5 then the result is two numbers 20 and 25.

If a second table, similar to that of FIG. 5, but omitting the asterisks and consecutively numbering each entry in the second table is prepared, then this second table can be used for a further Z transformation. This transforms the two numbers (20,25) into a single number being the number allocated to that particular entry in the second table.

It follows from the above that a sequence of numbers can be transformed, via any one of a large number of various routes, into a single number. The larger the number of members of the sequence, the larger the magnitude of the single number. However, the number of possible routes (each with a possible different mathematical procedure) and the number of possible Z transformations (given that the allocation of numbers to the table entries is arbitrary), makes "code breaking" extremely difficult. An estimate of this difficulty is given in the Appendix. Indeed, the arbitrary nature of the tabulation of the Z transformation is equivalent to a "one time pad".

It also follows from the above that the term "matrix" as used herein refers not only to conventional row, column or row and column matrices but also to vectors having components able to be represented by entries in such matrices.

Another advantage which is able to be obtained is the ability to avoid transmitting the entire magnitude of the encoded numerical result. For example, if the digital sequence to be encoded and transmitted is broken down into "packets" each of which is, say, 256 bits long, then a number of such 256 bit sequences will need to be transmitted.

Because the data to be transmitted will not normally be all zeros or all ones, the actual numerical result of the transformation will normally lie within a small range of the potential range of results. If the centre of this small range is known to both the transmitting and receiving party, then only the difference between the result and the centre of the range need be transmitted. This stratagem can substantially reduce the magnitude of the number(s) to be transmitted.

For matrices $$\begin{bmatrix} a & b \\ c & d \end{bmatrix}$$

of determinant 1 as has been described three numbers only need be known. It is possible to considerably reduce the magnitude of one of these three numbers thus enhancing the application of this transformation for data compression. One way of achieving this reduction relies on the observation that cb=ad−1 and each entry must be a whole number.

If for example b is not to be used then c can be replaced by a number indicating which of the possible factorisations of ad−1 into whole numbers corresponds to b and c.

For example $$\begin{bmatrix} 20 & 501 \\ 19 & 476 \end{bmatrix}$$

is such a matrix with a=20, b=501, c=19 and d=476.

As 20×476=9520 the product of b and c must be 9519. The only factorisations of 9519 are as shown below.

| FACTORISATION | c | b |
|---|---|---|
| 1 | 1 | 9519 |
| 2 | 3 | 3173 |
| 3 | 19 | 501 |
| 4 | 57 | 167 |
| 5 | 167 | 57 |
| 6 | 501 | 19 |
| 7 | 3173 | 3 |
| 8 | 9519 | 1 |

The number 3 can now be used to indicate the factorisation with c=19 and b=501 and the matrix $$\begin{bmatrix} 20 & 501 \\ 19 & 476 \end{bmatrix}$$

can be reconstructed from the number 20, 476, 3.

It can be shown from number theory that the magnitude of the number indicating a factorisation must in general be considerably less than the one half of the square root of the product of a and d. This matrix encodes 45 binary digits whereas the numbers 20, 476, 3 require 5, 9 and 2 binary digits to represent them—a total of 16.

Further reduction in the magnitude of the numbers can be achieved if the number that is omitted is always the largest. To achieve this information must be transmitted or stored indicating which has been eliminated. The cost of so doing is two binary digits with an arrangement such as 00 indicates a, 01 indicated b, 10 indicated c and 11 indicates d. It is a property of these matrices that the least entry is always diagonally opposite the greatest. This fact can be exploited by subtracting this least number from the other two being transmitted with the result remaining a positive number. It is a further property of these matrices that the numbers that remain after this operation are three numbers from which a valid matrix can be constructed. As a result the process described above for replacing one number by a number indicating a factorisation can be now applied.

For example, the matrix $$\begin{bmatrix} 80 & 57 \\ 167 & 119 \end{bmatrix}$$

has the greatest entry in the 'c' position and diagonally opposite in the 'b' position is the least value 57. Using * for the value not recorded the matrix becomes $$\begin{bmatrix} 80 & 57 \\ * & 119 \end{bmatrix}.$$

Subtracting the least entry b=57 from the remaining leaves $$\begin{bmatrix} 23 & 57 \\ * & 62 \end{bmatrix}$$

To attest that this is a valid matrix, check that (23×62)−1 can be evenly divided by 57; (23×62)−1=1425 and 1425 divided by 57 is 25 exactly, hence a=23, b=57, d=62 are entries from a valid matrix in which c=24. The factorisations of 1425 are:

| FACTORISATION | c | b |
| --- | --- | --- |
| 1 | 1 | 1425 |
| 2 | 3 | 475 |
| 3 | 5 | 285 |
| 4 | 15 | 95 |
| 5 | 19 | 75 |
| 6 | 25 | 57 |
| 7 | 57 | 25 |
| 8 | 75 | 19 |
| 9 | 95 | 15 |
| 10 | 285 | 5 |
| 11 | 475 | 3 |
| 12 | 1425 | 1 |

As b=57 occurs in the seventh factorisation the three numbers 23, 7, 62 and the two binary digits 10 are sufficient for the reconstruction of $$\begin{bmatrix} 80 & 57 \\ 167 & 119 \end{bmatrix}.$$

The property that the entries in the matrices are relative prime pairs can also be used to both eliminate various possible matrices since, as indicated in Table 3.1, not all possible matrices are valid. Further, if an arbitrary allocation of numbers is made to the matrices of Table 3.1 a transformation similar to the above described Z transformation, leading to still further data compression, can be achieved by the proceses that will be termed arithmetic transforms.

Arithmetic Transforms

The conversion yields relative prime integer pairs. The density of relative prime pairs is $6/\pi^9$, ·6079 . . . . The pairs a.b with (a,b)>1 that occupy the remaining places in an enumeration are exploited as follows.

Accept a,b positive integers with (a, b)=1.

Assume, without loss, a<b.

Set d=b−c.

Transform a to a' where a' is the ordinal position of a in the sequence of integers prime to d.

Set b'=a'+d.

The transform is invertible as d can be recovered from a', b' and the $a'^{th}$ integer prime to d is readily computed as follows. Given a and d, a' is computed from a vector $g_1 \ldots g_r$ where $g_i$ is a prime dividing d.

Full factorisation of d is not a practical procedure nor is it required. The contribution to numerical shrinkage that the $i^{th}$ prime can make is $$\frac{\Phi(p_i)}{p_i} = \frac{p_i - 1}{p_i}$$

This ratio rapidly approaches 1 for i increasing. For $i \geq 26$ the contribution of prime divisors is less than 1% and by i=169 is less than 0.01%. A numerical change of 50% is required to reduce the representation by 1 bit. Testing for divisibility by the first 63 primes is sufficient for an applied algorithm.

The transform so modified sets a' to be the ordinal position of a in the integers prime to the product of prime divisors (without repetition) of d that are less than or equal to the $r^{th}$ prime. If no prime divisors$\leq p_r$ are found d is treated as if it were prime. Call this transform $T_1$.

The underlying result that establishes isomorphism between finite binary sequences and relative prime pairs enables the mapping of an integer L(a,b), the length of the sequence represented, to each such pair.

If sequence length is known a transform can be applied which sets a' to be the ordinal position of a in the sequence of integers prime to d and of length L(a,b).

Call this transform $T_2$.

Given the result of $T_1$ the second transform can be readily computed by the application of identities that relate sequence length to the numerical representation.

A third transform $T_3$ is achieved by setting $T_3(a,b)$ to be the $a'^{th}$ relative prime pair in the enumeration of pairs prime to d, where a' is value derived from $T_2$. This variation preserves the capacity to later convert to a unique rational ratio.

When a representation for data blocks of fixed length is required a strategy of ignoring leading or trailing repeated bits can be applied. The appropriate transform $T_4$ then sets a' to be the ordinal position of a in the integers prime to d with length less than or equal to L(a,b).

The following table illustrates the effects of these transforms on relative prime pairs with difference 34.

| ORDINAL POSITION | 1 | 2 | 3 | 4 | 5 | 6 | 7 | 8 | 9 | 10 |
|---|---|---|---|---|---|---|---|---|---|---|
| REPRESENTATION | | | | | | | | | | |
| a | 1 | 3 | 5 | 7 | 9 | 11 | 13 | 15 | 19 | 21 |
| b | 35 | 37 | 39 | 41 | 43 | 45 | 47 | 49 | 53 | 55 |
| L (a,b) | 34 | 14 | 11 | 11 | 9 | 14 | 8 | 9 | 9 | 8 |
| $T_1$ | | | | | | | | | | |
| a | 1 | 2 | 3 | 4 | 5 | 6 | 7 | 8 | 9 | 10 |
| b | 35 | 36 | 37 | 38 | 39 | 40 | 41 | 42 | 43 | 44 |
| $T_2$ | | | | | | | | | | |
| a | 1 | 1 | 1 | 2 | 1 | 2 | 1 | 2 | 3 | 2 |
| b | 35 | 35 | 35 | 36 | 35 | 36 | 35 | 36 | 37 | 36 |
| $T_3$ | | | | | | | | | | |
| a | 1 | 1 | 1 | 3 | 1 | 3 | 1 | 3 | 5 | 3 |
| b | 35 | 35 | 35 | 37 | 35 | 37 | 35 | 37 | 39 | 37 |
| $T_4$ | | | | | | | | | | |
| a | 1 | 1 | 1 | 2 | 1 | 5 | 1 | 4 | 5 | 2 |
| b | 35 | 35 | 35 | 36 | 35 | 39 | 35 | 38 | 39 | 36 |

L(a,b) denotes the length of the sequence encoded by a,b.

Furthermore, as indicated in Table 3.2 the products of matrices can be similarly mapped. As the products are formed from two prime matrices, they are equivalent to binary sequences, that is sequences constructed from just two symbols (eg. 0 and 1).

The mathematical paper comprising the Appendix hereto discloses a general treatment. This general treatment deals with the construction of sets of functions that can be composed with each other so as to produce other functions such that no matter what finite number of composites are taken, the original sequence and order in which the composition was formed can always be faithfully recovered. In some cases these functions themselves have a simple numerical representation in which case the numerical representation of the result of composition can be used as a representation of data.

Alternatively, the resultant function can be used to operate on some other mathematical structure which is representable by objects over some number system.

In other cases the functions that are composed do not have particularly convenient numerical forms, however their action on other numerically based mathematical structures result in numerical encoding with the desired properties.

Non-linear Operations

The general treatment in the Appendix is not restricted to linear operations. However, non-linear operations are not always conveniently expressed in matrix form.

The following example involves both linear and non-linear operations and the form of expression chosen is a statement of rules for the performance of operations (ie. an algorithm). An advantage of this form of expression is that the effect of several operations (linear or non-linear) can be expressed in the statement of a further algorithm.

Step E1

Associate with each symbol of the alphabet a numerical variable, eg. if A is in the alphabet q(A) is the variable associated with A.

Step E2

Allocate an order to the variables so that each variable has a separate position number, eg. for an alphabet of three symbols A,B,C six orders are possible.

| | ORDER | | | | | |
|---|---|---|---|---|---|---|
| POSITION | 1 | 2 | 3 | 4 | 5 | 6 |
| 1 | q(A) | q(A) | q(B) | q(B) | q(C) | q(C) |
| 2 | q(B) | q(C) | q(A) | q(C) | q(A) | q(B) |
| 3 | q(C) | q(B) | q(C) | q(A) | q(B) | q(A) |

Step E3

Set the value of the variable of the first symbol to 2 and all other variables to 1.

Step E4

E4.1 consider the next symbol to be encoded and determine the largest value among the variables other than the one associated with the variable being considered—call this largest value D.

E4.2 denote by P the highest position number among the variables with the value D, other than the one associated with the variable being considered.

E4.3 set the value of the symbol being considered to the sum of its present value and D.

E4.4 if the position number of the variable being considered is greater than P, then reduce the value set in step E4.3 by 1.

Step E5

If the symbol being considered is the last in the sequence to be encoded then the process terminates, otherwise go to (or repeat) Step E4.

For example, encoding the sequence ABCAABC requires three variables q(A), q(B), q(C). The chosen order for encoding in this example is the first order of the above table, that is the position of q(A)=1, the position of q(B)=2, and the position of q(C)=3.

For the first letter of the sequence A, in accordance with Step E3, set the first symbol q(A) to 2 and the remaining variables or symbols q(B) and q(C) to 1. This creates the first "line" in an encoding table as follows:

| | q(A) | q(B) | q(C) |
|---|---|---|---|
| A | 2 | 1 | 1 |

The steps carried out can be set out as follows:

| | |
|---|---|
| E1 | Assign |
| | q(A) to the letter A |
| | q(b) to the letter B |
| | q(C) to the letter C |
| E2 | Assign |
| | position number 1 to q(A) |
| | position number 2 to q(B) |
| | position number e to q(C) |
| E3 | First symbol A |
| | set q(A) = 2, |
| | set q(B) = 1, |
| | set q(C) = 1. |

Summary-Symbol encoded A, present values q(A) = 2, q(B) = 1, q(C) = 1

Now go onto step E4 by considering the next symbol of the sequence which is the letter B E4  Next symbol B
   E4.1 Variables other than q(B) are q(A) = 2 and q(C) = 1,
        q(A) > q(C), hence D = 2.
   E4.2 Only q(A) is equal to D. Position number of q(A) is 1, hence
        P = 1.
   E4.3 B is assigned to q(B).
        The present value of q(B) is 1.
        Set q(B) to 1 + D = 1 + 2 = 3.
   E4.4 Position number of q(B) is 2 and P = 1 so the position number
        of symbol being considered is greater than P. Reducing the value of
        q(B) set in 4.3 by 1 gives q(B) = 2.
Summary-Symbol encoded B, present values q(A) = 2, q(B) = 2, q(C) = 1

Thus the second "line" in the encoding table is as follows:

| | q(A) | q(B) | q(C) |
|---|---|---|---|
| B | 2 | 2* | 1 |

*where 2 = 2 + 1 − 1

The process is repeated so as to build up the full encoding table.

E5  B is not the last symbol, go to step E4.
E4  Next symbol is C
   E4.1 Variables other than q(C) are q(A) = 2 and q(B) = 2 hence
        D = 2.
   E4.2 Both q(A) and q(B) equal D. Position number of q(A) is 1 and
        of q(B) is 2, hence 2 is the higher position number among the
        variables other than q(C) so set P = 2.
   E4.3 C is assigned to q(C) which has present value 1.
        Set q(C) = 1 + D = 1 + 2 = 3.
   E4.4 Position number of q(C) is 3 which is greater than P of E4.2 so
        reduce the value of q(C) set in E4.3 by 1.
        q(C) = 3 − 1 = 2.
Summary-Symbol encoded C, present values q(A) = 2, q(B) = 2, q(C) = 2
E5  C is not the last symbol, go to step E4.
E4  Next symbol A.
   E4.1 Variables other than q(A) are q(B) = 2 and q(C) = 2 hence
        D = 2.
   E4.2 Both q(B) and q(C) = 2.
        The position number of q(C) = 3 is greater than the position number
        of q(B) hence P = 3.
   E4.4 The position number of q(A) is 1 which is less than P so q(A) is
        not reduced by 1.
Summary-Symbol encoded A, present values q(A) = 4, q(B) = 2, q(C) = 2
E5  A is not the last symbol, go to step E4.
   E4.1 Variables other than q(A) are q(B) = 2 and q(C) = 2,
        2 is the greatest value, set D = 2
   E4.2 Both q(B) and q(C) equal D, however, the position number of
        q(C) is greater than the position number of q(B) so P is set to the
        position number of q(C) hence P = 3.
   E4.3 The present value of q(A) is 4.
        Set q(A) to 4 + d = 4 + 2 = 6.
   E4.4 The position number of q(A) is 1 which is less than P currently
        set to 3 so q(A) is not reduced by 1.
Summary-Symbol encoded A, present values q(A) = 6, q(B) = 2, q(C) = 2

Thus the full encoding table is as follows:

| SEQUENCE | q(A) | q(B) | q(C) |
|---|---|---|---|
| A | 2 | 1 (2 + 1 − 1) | 1 |
| B | 2 | 2 | 1 (2 + 1 − 1) |
| C | 2 (2 + 2) | 2 | 2 |
| A | 4 (4 + 2) | 2 | 2 |
| A | 6 | 2 (6 + 2 − 1) | 2 |
| B | 6 | 7 | 2 (7 + 2 − 1) |
| C | 6 | 7 | 8 |

The output from the algorithm is a numerical representation for the input sequence of letters in this example, the numbers 6,7,8 in this order represent the sequence ABCAABC.

In order to decode the decoder must know

1. That the numbers 6,7,8 means q(A)=6, q(B)=7, q(C)=8.
2. The chosen order for encoding—in this case
   position of q(A)=1
   position of q(B)=2
   position of q(C)=3.

The knowledge required for decoding can be considered as the key for an encrypted message.

Numerical representations are decoded by the following procedure. Consider the numerical representation and, Step D1.

Determine the variable with the largest value.

If more than one variable has the largest number select from these the one with highest position number—call this value R.

Step D2.

Emit the symbol associated with the variable determined in step D1.

Step D3.

Determine the highest value among variables other than the variable determined in step D1.—call this value D.

Step D4.

Determine the highest position number of variables with the value of D from step D3, excluding the variable determined in step D1. Call this position number P.

Step D5.

Set the value in the variable from step D1 to R−D.

Step D6.

If the position number of the variable from step D1 is greater than P then increase its value by 1.

Step D7.

If one value is 2 and all other values are 1 then terminate, otherwise go to step D1.

Decoding the present example proceeds as follows:

| q(A) | q(B) | q(C) | EMIT |
|---|---|---|---|
| 6 | 7 | (8 − 7 + 1) 2 | B |
| 6 | (7 − 6 + 1) 2 | 2 | A |
| (6 − 2) 4 | 2 | 2 | A |
| 2 | 2 | 2 | C |
| 2 | (2 − 2 + 1) 1 | 1 | A |

In this example the variable to be increased is determined only by the symbol to be encoded. Another method is to make this determination dependent on both the next symbol to be encoded and the variable determined for the symbol before it. Such systems are termed "transition or finite state systems" and have a fundamental role in many applied sciences including electronic engineering (see "Switching Theory, Volume 2: Sequential Circuits and Machines", Raymond E Miller, (1965) Published by John Wiley & Sons, Inc.) and linguistics (see "Formal Languages and their Relation to Automata", John E Hopcroft and Jeffrey D Ullman, (1969) Published by Addison-Wesley Publishing Company, Inc.). The development in linguistics has application in digital processing of natural and formal languages (see "Text Compression", Timothy C Bell, et al; (1990) Published by Prentice-Hall Inc.). By associating variables with states these procedures give a numerical representation of the behaviour of finite state devices.

The application of the above to the representation of data and text is achieved as follows:

Variables are assigned numbers as they are not assigned directly to letters of an alphabet. There must be at least as many variables as alphabet symbols if all possible sequences are to be represented, however any countable number of variables can be employed. Some applications do not require all possible sequences to be represented in which case it is possible to find a representation with less variables than symbols.

As for the previous example variables are assigned an order. In the example that follows the "natural" order is chosen ie. position of q1 is 1, q2 is 2 . . . .

|   | A | B | C |
|---|---|---|---|
| q1 | q2 | q3 | q3 |
| q2 | q4 | q1 | q2 |
| q3 | q3 | q4 | q1 |
| q4 | q2 | q3 | q4 | eg. if the last variable increased was q2 and the next symbol is A then the next variable to be increased is q4.

An "initial" or "start" variable must be nominated. Different numerical representations arise from each possible start state, eg. encoding ABCA.

|   | q1 | q2 | q3 | q4 |
|---|---|---|---|---|
|   |   | start = q2 |   |   |
| A | 1 | 1 | 1 (2 + 1) | 2 |
| B | 1 (1 + 3) | 1 | 3 | 2 |
| C | 4 (4 + 3) | 1 | 3 | 2 |
| A | 1 | 1 | 3 | 2 |

|   | q1 | q2 | q3 | q4 |
|---|---|---|---|---|
|   |   | start = q1 |   |   |
| A | 2 | 1 (2 + 1 − 1) | 1 | 1 |
| B | 2 | 2 (2 + 2 − 1) | 1 | 1 |
| C | 2 | 3 | 1 | 1 (3 + 1 − 1) |
| A | 2 | 3 | 1 | 3 |

Thus the same sequence ABCA can be encoded either as 7132 or as 2313. Decoding requires a key that is knowledge of 1. The order assigned to variables.
2. The transition table.
3. The start state.

From the transition table a table is constructed from which can be read the output symbol for each possible transition between variables. For the present example the table is:

|   | q1 | q2 | q3 | q4 |
|---|---|---|---|---|
| q1 | A | B | C | — |
| q2 | B | C | — | A |
| q3 | C | — | A | B |
| q4 | — | A | B | C |

With due change of detail decoding follows the procedure D1 to D5.

Another direction of generalisation allows each numerical variable to be replaced by a collection of variables, termed subvariables. When executing an encoding algorithm at the stage at which the value in one variable is to be added to another, a single subvariable of one is added to a single subvariable of the other.

Rules for selecting the subvariables can take a variety of forms, two are described below.

Selection Rules.

EXAMPLE 1

Unordered Subvariables

This selection rule is based on the magnitude of subvariables only and does not require their order to be maintained. All subvariables are initially set to 1.

(a) The magnitude of a variable is taken to be the greatest value among its subvariables.

(b) The sum required by E 4.3 is performed as follows

Select any subvariable with a value equal to the least value among the subvariables being considered and set its value to the sum of its present value and D. The value D having been determined with the rule (a) as above.

To encode the sequence 10010 proceed as follows:

```
10010
({1 1 1 1}, {1 1 1})1
({2 1 1 1}, {1 1 1})0
({2 1 1 1}, {2 1 1})0
({2 1 1 1}, {2 2 1})1
({2 3 1 1}, {2 2 1})0
({2 3 1 1}, {2 2 3})
```

Decoding proceeds as follows:

$$(\{2\ 3\ 1\ 1\},\ \{2\ 2\ 3\})0$$
$$(\{2\ 3\ 1\ 1\},\ \{2\ 2\ 1\})1$$
$$(\{2\ 1\ 1\ 1\},\ \{2\ 2\ 1\})0$$
$$(\{2\ 1\ 1\ 1\},\ \{1\ 2\ 1\})0$$
$$(\{2\ 1\ 1\ 1\},\ \{1\ 1\ 1\})1$$
$$(\{1\ 1\ 1\ 1\},\ \{1\ 1\ 1\})$$
$$01001^R = 10010$$

As the order among subvariables need not be known to decode they can be arranged in ascending order of magnitude which allows them to be efficiently stored or transmitted as successive differences, eg. 6,6,8,12,17 becomes 6, $(6-6)_0$, $(8-6)_2$, $(12-8)_4$, $(17-12)_5$ and reconstructed by 6, $(6+0)_6$, $(6+2)_8$, $(8+4)_{12}$, $(5+12)_{17}$.

EXAMPLE 2

Ordered Subvariables

If subvariables as well as variables are given a position number, then the sum required by Step E4.3 can be determined by specifying the order in which subvariables are used. The order can be specified by a sequence of any length. For example assume that a variable q(x) is assigned subvariables then the sequence

```
1 2 3 4 5 6 7 8 9 11 1 1 1 1 1 1
3 2 3 1 1 2 3 2 2 2 3 1 2 3 3 1 1 . . .
``` is interpreted as follows.

The first time q(x) is added to take the sum with subvariable 3, the second time with subvariable 2, and so on. A different use order can be assigned to each variable.

Specification of order of use must be known to decode the resultant numerical representation and becomes a component of the key for encryption.

The following modification to the algorithms given for encoding sequences of positive numbers is appropriate for alphabets of any finite size. It is not linear.

Assign to each letter of an alphabet comprising s symbols a distinct integer in the range 1 to s.

If a and b are integers denote by a\b the greatest integer less than or equal to the result of dividing a by b, examples 7\2=3, 7\8=0, 7\1=7

Replace the symbols in a sequence by the integers assigned to them thus forming a sequence of integers $n_1$, $n_2$ . . . $n_i$ . . . indexed by i.

Step 1. Set a 2×1 matrix $$\begin{bmatrix} a \\ b \end{bmatrix}$$

to the value $$\begin{bmatrix} 1 \\ 1 \end{bmatrix}$$

Step 2. If i is odd then
    Set D=b−b\s
    Set a=a+(n$_i$×D)
If i is even then
    Set D=a−a\s
    Set b=b+(n$_i$×D)

Step 3. If the last integer is reached emit the present value of a and b otherwise goto Step 2 and repeat for the next number.

To decode

Step 1. Accept a and b

Step 2. If a>b then
    Set D=b\s determine the least number n such that
    a−(n×D) is less than or equal to b
    Emit n
If b>a then
    Set D=a\s determine the least number n such that
    b−(n×D) is less than or equal to b
    Emit n
If a=b then end.

Step 3. Goto Step 2.

The procedures described involve only the operations of addition and subtraction of whole numbers (integers) and the determination of greatest and least values among a collection of integers.

The formulation provided in the appended paper is far more general. There is a technical (ie. mathematical) sense in which the examples based on integers, addition, subtraction and multiplication provide a generic model for most of the cases covered by the general treatment appended.

Most of the general treatment is homomorphic to the integer case meaning that rules can be found (in principle) which allow them to be recognised as being of the same general form. An elementary example is provided by multiplication of numbers less than 1.

One of the additive encoding of 011 can be displayed by (1,1)0(1,2)1(3,2)1(5,2) where the left is added to the right for 0 and add right to left for 1.

If the initial (1,1) is replaced by (·1,·1) and multiply the right by the left for 0 and multiply left by the right for 1, the encoding becomes—(·1,·1)0(·1,·01)1(·001,·01)1(·00001, 01).

Decoding involves finding the numerically smaller of a pair then dividing.

The relation between the two is revealed if the entries in the second case are replaced by the number of decimal places eg. ·01 has two decimal places so it is replaced by a 2. If this is done the additive case results $$(\cdot1,\cdot1)\ 0\ (\cdot1,\cdot01)\ 1\ (\cdot001,\cdot01)\ 1\ (\cdot00001,\cdot01)$$
$$\downarrow\downarrow\ \ \downarrow\ \downarrow\ \ \ \downarrow\ \downarrow\ \ \ \ \downarrow\ \downarrow$$
$$(1,\ 1)\ 0\ (1,\ \ 2)\ 1\ (\ 3,\ \ 2\ )\ 1\ (\ 5\ \ ,\ 2\ ).$$

Knowledge about which operations have been used and the initial values chosen become another component of a key for encryption and decryption.

It is not the case that the present invention is restricted to binary. The following tables set out encodings of hexadecimal and the ordinary English alphabets.

| 10A3B-E610-AB91 | | | | | | | | | |
|---|---|---|---|---|---|---|---|---|---|
| | 1 | 0 | A | 3 | B | — | E | 6 | 9 |
| 1 | 2 | 1 | 1 | 1 | 1 | 1 | 1 | 1 | 1 |
| 0 | 2 | 2 | 1 | 1 | 1 | 1 | 1 | 1 | 1 |
| A | 2 | 2 | 2 | 1 | 1 | 1 | 1 | 1 | 1 |
| 3 | 2 | 2 | 2 | 2 | 1 | 1 | 1 | 1 | 1 |
| B | 2 | 2 | 2 | 2 | 2 | 1 | 1 | 1 | 1 |
| — | 2 | 2 | 2 | 2 | 2 | 2 | 1 | 1 | 1 |
| E | 2 | 2 | 2 | 2 | 2 | 2 | 2 | 1 | 1 |
| 6 | 2 | 2 | 2 | 2 | 2 | 2 | 2 | 2 | 1 |
| 1 | 4 | 2 | 2 | 2 | 2 | 2 | 2 | 2 | 1 |
| 0 | 4 | 5 | 2 | 2 | 2 | 2 | 2 | 2 | 1 |
| — | 4 | 5 | 2 | 2 | 2 | 6 | 2 | 2 | 1 |
| A | 4 | 5 | 8 | 2 | 2 | 6 | 2 | 2 | 1 |
| B | 4 | 5 | 8 | 2 | 9 | 6 | 2 | 2 | 1 |

-continued

10A3B-E610-AB91

|   | 1  | 0 | A | 3 | B | — | E | 6 | 9 |
|---|----|---|---|---|---|---|---|---|---|
| 0 | 4  | 5 | 8 | 2 | 9 | 6 | 2 | 2 | 9 |
| 1 | 13 | 5 | 8 | 2 | 9 | 6 | 2 | 2 | 9 |
| 1 | 13 | 5 | 8 | 2 | 9 | 6 | 2 | 2 | 9 |
| 9 | 4  | 5 | 8 | 2 | 9 | 6 | 2 | 2 | 9 |
| B | 4  | 5 | 8 | 2 | 9 | 6 | 2 | 2 | 1 |
| A | 4  | 5 | 8 | 2 | 2 | 6 | 2 | 2 | 1 |
| — | 4  | 5 | 2 | 2 | 2 | 6 | 2 | 2 | 1 |
| 0 | 4  | 5 | 2 | 2 | 2 | 2 | 2 | 2 | 1 |
| 1 | 4  | 2 | 2 | 2 | 2 | 2 | 2 | 2 | 1 |
| 6 | 2  | 2 | 2 | 2 | 2 | 2 | 2 | 2 | 1 |
| E | 2  | 2 | 2 | 2 | 2 | 2 | 2 | 1 | 1 |
| — | 2  | 2 | 2 | 2 | 2 | 2 | 1 | 1 | 1 |
| B | 2  | 2 | 2 | 2 | 2 | 1 | 1 | 1 | 1 |
| 3 | 2  | 2 | 2 | 2 | 1 | 1 | 1 | 1 | 1 |
| A | 2  | 2 | 2 | 1 | 1 | 1 | 1 | 1 | 1 |
| 0 | 2  | 2 | 1 | 1 | 1 | 1 | 1 | 1 | 1 |
| 1 | 2  | 1 | 1 | 1 | 1 | 1 | 1 | 1 | 1 |

In the above, the hyphen (-) represents a blank space.

Furthermore, the encoding can be used to produce very great savings in the representation of text, instructions, warning messages and the like. This is particularly useful for small items such as resistors which can be provided with part numbers represented, say as machine readable bar codes. Alternatively, a warning message such as DO NOT INCINERATE can be encoded and decoded in accordance with the following

DO NOT INCINERATE

|   | D | O | — | N | T | I | C | E | R | A |
|---|---|---|---|---|---|---|---|---|---|---|
| D | 2 | 1 | 1 | 1 | 1 | 1 | 1 | 1 | 1 | 1 |
| O | 2 | 2 | 1 | 1 | 1 | 1 | 1 | 1 | 1 |   |
| — | 2 | 2 | 2 | 1 | 1 | 1 | 1 | 1 | 1 | 1 |
| N | 2 | 2 | 2 | 2 | 1 | 1 | 1 | 1 | 1 | 1 |
| O | 2 | 4 | 2 | 2 | 1 | 1 | 1 | 1 | 1 | 1 |
| T | 2 | 4 | 2 | 2 | 4 | 1 | 1 | 1 | 1 | 1 |
| — | 2 | 4 | 6 | 2 | 4 | 1 | 1 | 1 | 1 | 1 |
| I | 2 | 4 | 6 | 2 | 4 | 6 | 1 | 1 | 1 | 1 |
| N | 2 | 4 | 6 | 8 | 4 | 6 | 1 | 1 | 1 | 1 |
| C | 2 | 4 | 6 | 8 | 4 | 6 | 8 | 1 | 1 | 1 |
| I | 2 | 4 | 6 | 8 | 4 | 14| 8 | 1 | 1 | 1 |
| N | 2 | 4 | 6 | 22| 4 | 14| 8 | 1 | 1 | 1 |
| E | 2 | 4 | 6 | 22| 4 | 14| 8 | 22| 1 | 1 |
| R | 2 | 4 | 6 | 22| 4 | 14| 8 | 22| 22| 1 |
| A | 2 | 4 | 6 | 22| 4 | 14| 8 | 22| 22| 22|
| T | 2 | 4 | 6 | 22| 26| 14| 8 | 22| 22| 22|
| E | 2 | 4 | 6 | 22| 26| 14| 8 | 47| 22| 22|
| E | 2 | 4 | 6 | 22| 26| 14| 8 | 47| 22| 22|
| T | 2 | 4 | 6 | 22| 26| 14| 8 | 22| 22| 22|
| A | 2 | 4 | 6 | 22| 4 | 14| 8 | 22| 22| 22|
| R | 2 | 4 | 6 | 22| 4 | 14| 8 | 22| 22| 1 |
| E | 2 | 4 | 6 | 22| 4 | 14| 8 | 22| 1 | 1 |
| N | 2 | 4 | 6 | 22| 4 | 14| 8 | 1 | 1 | 1 |
| I | 2 | 4 | 6 | 8 | 4 | 14| 8 | 1 | 1 | 1 |
| C | 2 | 4 | 6 | 8 | 4 | 6 | 8 | 1 | 1 | 1 |
| N | 2 | 4 | 6 | 8 | 4 | 6 | 1 | 1 | 1 | 1 |
| I | 2 | 4 | 6 | 2 | 4 | 6 | 1 | 1 | 1 | 1 |
| — | 2 | 4 | 6 | 2 | 4 | 1 | 1 | 1 | 1 | 1 |
| T | 2 | 4 | 2 | 2 | 4 | 1 | 1 | 1 | 1 | 1 |
| O | 2 | 4 | 2 | 2 | 1 | 1 | 1 | 1 | 1 | 1 |
| N | 2 | 2 | 2 | 2 | 1 | 1 | 1 | 1 | 1 | 1 |
| — | 2 | 2 | 2 | 1 | 1 | 1 | 1 | 1 | 1 | 1 |
| O | 2 | 2 | 1 | 1 | 1 | 1 | 1 | 1 | 1 | 1 |
| D | 2 | 1 | 1 | 1 | 1 | 1 | 1 | 1 | 1 | 1 |

DO NOT INCINERATE

As an example of a bar code produced in accordance with the above, in FIG. 5 is reproduced a bar code which represents the number 2 4 6 22 26 14 8 47 22 and 22.

It will be immediately apparent that if there is an agreed method of representing the text of standard warnings so that, for example

* represents STERILE PROVIDED PACKAGE IS INTACT AND UNOPENED
© represents ALLERGIC TO PENICILLIN then large volumes of text of standard messages can be condensed into, say, bar codes which are both machine readable (as at present) but also then decoded by the machine. As a consequence, "wiping" the bar code with a light pen would result in the screen of the machine displaying the full text of the decoded message.

Egyptian Fractions

The transformation from a 2×2 matrix to a 2×1 matrix, equivalent to a rational number, can be used to explicate consideration of the decomposition of rationals into partial fractions. The relationship with decomposition into distinct Egyptian (unit) fractions is immediate since in order that such a process terminates the final step is a subtraction of the form $a/c - b/d$ constrained by the requirement that $ad - bc = 1$.

Because $ad - bc = 1$ is another way of representing the matrix $$\begin{bmatrix} a & b \\ c & d \end{bmatrix} = 1.$$

The following technique is essentially equivalent to a matrix technique but expressed in different notation.

This procedure generalises to enable encoding sequences over k different symbols as follows:

Step 1. Assign to each of the k symbols a distinct integer in the range 0 to k−1. For example over 7 symbols 1,0,6,5,3,1,2 would be a possible sequence.

Assign to the sequence a pair of integers $$a = \sum_{j=1}^{n} c_j k^u$$

$$b = k^v$$

where $$u = \left( \sum_{j=1}^{n} c_i \right) - c_j$$

$$v = \sum_{i=1}^{n} c_i i$$

a and b divided by (a,b).

This expression is equivalent to forming the sums of the form $c_1/k^1 + c_2/k^2 \ldots c_n/k^n$.

For example the sequence 1,2,0,5,3 with k=6 of length n=5 is assigned the partial fraction $$1/6 + 2/6^2 + 0/6^3 + 5/6^4 + 3/6^5 = 1/6 + 2/6^2 + 5/6^4 + 3/6^5 = \frac{587}{2592}$$

The rational number is "decoded" as follows

Step 1. Accept a,b
Set n=1
Step 2. Set m=k−1
Step 3. If m/kn is less than or equal to the rational number a/b then
Emit m
Set n=n+1

Goto Step 2
Else if m>1
   Set m=m−1, repeat Step 3
Else if m=1
   Emit 0
   Set n=n+1
If n=string length then end
Else goto Step 2.

Miscellaneous

Pairs of relative prime numbers form the mathematical system of rational numbers (fractions) conventionally denoted by Q. The elements of $Q^+$ are the positive rational numbers. Rational numbers have a variety of representations.

The following three methods of representing rational numbers are those treated in the standard references "Handbook of Mathematical Function", Ed. Milton Abramowitz and Irene A. Stegun, (Dover Publications, Inc.; New York, 9th Ed, 1970.) "Handbook of Mathematical, Scientific, and Engineering Formulas, Tables, Functions, Graphs, Transforms", Staff of Research and Education Association, Dr. M. Fogiel, Director, (REA 61 Ethel Rd West, Piscataway, N.J. 1989).

(1) A pair of positive integers eg. 3,7.
(2) As a decimal number that either terminates or (after a certain stage) recurs.

The "decimal" for a rational number may terminate in one scale and recur in another. For example 1/7=0.142857 in the scale of 10 and ·1 in the scale of 7.

(3) A regular continued fraction $$a_0 + \cfrac{1}{a_1 + \cfrac{1}{a_2 + \cfrac{1}{a_3 + \ldots}}}$$

which is completely described by the sequence $a_0, a_1, a_2, a_3 \ldots$.

Unlike decimal or place notation in 2 above, the continued fraction representing a rational number always terminates, and is independent of the number scale (except for the choice of scale to represent the integers in the sequence $a_0, a_1 \ldots a_n$).

For example 27/38 has a decimal place notation of 0·7105263157894736842 (scale 10) and the sequence 1,2,2,5 represents the continued fraction $$1 + \cfrac{1}{2 + \cfrac{1}{2 + \cfrac{1}{5}}}$$

which is equivalent to 27/38.

The following table shows the place representation in scales 2 to 9.

SCALE 27/38

| Scale | Representation |
|---|---|
| 2: | 0·1 0 1 1 0 1 0 1 1 1 1 0 0 1 0 1 0 0 0 |
| 3: | 0·2 0 1 0 1 1 2 2 2 0 2 1 2 1 1 0 0 0 |
| 4: | 0·2 3 1 1 3 2 1 1 0 0 |
| 5: | 0·3 2 3 4 0 1 4 4 1 |
| 6: | 0·4 1 3 2 5 0 1 5 2 1 |
| 7: | 0·4 6 5 |
| 8: | 0·5 5 3 6 2 4 1 |
| 9: | 0·6 3 4 8 6 7 7 3 0 |

It is evident that the numerical efficiency of place notation is variable. The number of places required depends on the factor structure of the scale in relation to the denominator and the exponent to which the scale belongs mod the denominator.

For the purposes of data processing and storage numerically efficient representation of rational numbers that would be used to represent data sequences become of central commercial importance. The patent application deals with several efficient alternatives developed by the applicant discussed under the heading "Compression".

The mathematical results appended show that finite sequences of binary digits are related to positive rational numbers in the following way.

1. Every finite sequence of binary digits is represented by a unique positive rational number.
2. Every positive rational number is related to (determined by) a unique finite binary sequence.
3. The binary sequence of particular rational numbers can be calculated by applying an algorithm which involves only comparison and subtraction as follows, Step 1. Accept a and b
   set X=a, Y=b
Step 2. If X>Y emit 0 set X=X−Y
   If Y>X emit 1 set Y=Y−X
Step 3. If X=Y END else
   goto step 2.

4. The positive rational numbers associated with a particular binary sequence can be calculated by applying an algorithm that involves discrimination between input values and addition only.

Step 1. Set X to any non-zero value.
   Set Y=X.
Step 2. Input binary digits.
Step 3. If input=0 set Y=Y+X
   If input=1 set X=X+Y.
Step 4. If last input then end and output X,Y
   else goto step 2.

5. The relationship between the positive rational number of a binary sequence and positive rational number in the reverse order is
   $X' = [X]_y^{-1}$
   $Y' = [Y]_x^{-1}$ 6. Every positive rational number is uniquely represented by a 2×2 positive integer matrix of determinant 1—hereafter called a 'valid matrix'.
7. Every valid matrix is uniquely represented by a positive rational number.
8. The positive rational number associated with a valid matrix can be calculated as explained above.
9. The valid matrix associated with a positive rational number can be determined as explained above.
10. The results 1–9 above allow finite binary sequences, positive rational numbers and valid matrices to be used interchangeably. Some consequence of this interchangeability are:

A. Since positive rational numbers, finite binary sequences and valid matrices are interchangeable, an operation on one of these three has a corresponding operation for each of the other two. Thus multiplying two valid matrices "joins" or concatenates the corresponding binary sequences. The corresponding operation on rational numbers is not yet named in mathematical literature (but understood and well defined). Similarly, the addition of rational numbers produces a combination of binary sequences for which no name has yet been coined.

Further, inverting a rational number (so that a/b becomes b/a) corresponds to taking the complement of a binary sequence—a process basic to digital electronics and especially logic circuits. The corresponding action on a valid matrix is to generate a transpose about the minor axis. That is, $$\begin{bmatrix} a & b \\ c & d \end{bmatrix}$$

is transposed to $$\begin{bmatrix} d & b \\ c & a \end{bmatrix}.$$

B. The encoding into two numbers and the encoding into four numbers result in number pairs that have no factors in common other than 1, that is they are relative prime pairs. Another interpretation of such pairs is that they represent the ratio of two magnitudes. From this point of view the particular numbers chosen to represent the ratio is not important.

For example, ·5/·18, 5000/8000, 25/40, 5√2/8√2, 300/480 all represent the same ratio and the same rational number and the algorithm given at 3 above will yield the same binary sequence regardless of which of these pairs is used. In some practical affairs the difference in magnitude is of the essence, for example the instruction 'mix 25 bags of cement with 40 bags of sand' cannot be replaced with 'mix 5 bags of cement with 8 bags of sand'. The ratio of sand to cement is maintained, however, the total volume of the mix is not.

However, in some applications of the present invention only the ratio is relevant. The decimal notation for the number pairs above is the same for all, that is ·625. The result of dividing 5 by 8, 5000 by 8000, 25 by 40, 5√2 by 8√2, 300 by 480 is exactly ·625 in each case.

Thus, the algorithm given in 3 above can be modified at Step 1 so that we set X=1, and set Y=the decimal representation of a/b. Thereafter the algorithm proceeds as given above.

C. A pair of relative prime integers can always be recovered from the decimal form of a rational number even when repeating digits are involved. For example x=·37˙=·373737 . . . multiplying both sides by 100 yields 100x=37·37˙=37+x that is 100x=37+x from which follows 99x=37 thus x=37/99. The decimal notation for rational numbers always has a terminating decimal part or a sequence of repeating digits. This fact is used with new theorems in the mathematical paper annexed hereto to show that non-rational decimal numbers (eg. √2, π) uniquely represent distinct infinite binary sequences.

This property can be exploited as it is important in distinguishing various combinations of periodic waves (continuous periodic functions) for example the sinusoidal waves that characterise radio and electronic communication systems.

The ratio of parameters defining a sinusoidal wave can be exploited to transmit digitised information by the processes of this invention. The ratio of frequency and amplitude or phase and frequency or any of the other combinations can be set to transmit a rational ratio corresponding to the result of encoding a data sequence. Propagation of waves with these characteristics allows the transmission of a ratio which on reception provide the information sufficient for the recovery of the encoded data sequence by the algorithms described above. It is also possible to combine several frequencies with the required ratio into a single complex wave form which can, by conventional methods, be later decomposed into the component frequencies from which the ratio is immediately available.

The pair X,Y that result from a two number encoding can be used as parameters in the equations describing these waveforms Y=α sin (fω+v) where α is the parameter by which amplitude is determined and f is the parameter by which frequency is determined.

If two waves are generated with the form $a_1$ sin (Xω+v) and $a_2$ sin (Yω+v) then the wave generated by their sum, namely $$a_1 \sin (X\omega+v) + a_2 \sin (Y\omega+v)$$

is periodic with period 2π. If X and Y are not relative primes then the resultant wave will also be periodic with period 2π/n where n is the highest common factor of X and Y.

This property allows information to be embedded within electromagnetic radiation and propagated with that radiation, or to be embedded in other forms of sinusoidal electric signals.

The foregoing describes only some embodiments of the present invention, further disclosure of which is contained in the mathematical paper forming the Appendix hereto.

From these mathematical results it follows that:

1. Any physical system with a parameter which can take rational values, can be used to represent digital data whether as a storage medium in which the data is recorded or as a transmission medium in which the data is transferred from one place to another. If two parameters are employed, the representation is unaffected by uniform decay of their values. In this context uniform decay is independent of magnitude, for example the decay of charge on two identical capacitors.

2. Any physical system which has the properties of 1 above and can (a) be induced to discriminate between two external conditions, or (b) have two parameters that can be induced to vary in response to this discrimination as implied in the given algorithms, or any isomorphic operation thereof, is capable of encoding and decoding data.

APPENDIX

Mathematical Paper Entitled:

THE NUMERICAL REPRESENTATION OF FINITELY GENERATED SEMIGROUPS to be offered for publication to the

BRITISH JOURNAL OF MATHEMATICS or

THE JOURNAL OF THE ASSOCIATION FOR COMPUTING MACHINERY

PREFACE

The results reported here have arisen from the continued consideration of matters treated in the authors doctoral thesis (Masters, 1971). In this work non standard representations of certain infinite subsets of finitely generated semigroups were considered, one aim being to find physical representations suitable for empirical neuropsychological research. In this process ubiquitous physical considerations, symmetries and relative magnitudes for example, play a role for which pure mathematical research has no motivation to consider.

The parallel investigation of transformations and invariants required for the case of patterned physical stimuli, and number theoretic considerations, in the case of absolute and relative changes in stimuli presented sequentially, has yielded a series of results on the algebraic, numerical and physical representation of phenomena for which semigroup theory is an appropriate model. Since this includes digitised data as one case in point, results have immediate practical and commercial significance.

At present digitised information is represented for storage, processing and transmission by a large unbounded number of variables which take a very small range of values (usually 0 and 1).

This paper describes a representation which inverts this situation and digitised information is represented by a small, fixed number of variables which can take a large range of values.

From a formal point of view the existing representation constitutes a subsystem of the new. In practice the new representation has a number of distinct advantages, and many processes difficult in the old can be simply and elegantly achieved in the new.

Finitely generated free semigroups are the mathematical counterparts of digitalised information. If the digitalisation recognise two values the appropriate semigroup is the free semigroup over two generators and in general a digitisation that recognises n values has associated a free semigroup over n generators.

In a manner that is precisely parallel, mathematical theorems recognise that the free semigroup over two symbols can be used to model those over any infinite number of generators, as engineers exploit binary representation to model all forms of digitised data.

The mathematical theory of semigroups has developed as an analytic tool in the study of data processing systems and the formal (programming) languages designed for them.

In many branches of modern algebra a numerical representation of the structures used for the analysis of engineering systems has been achieved. When achieved numerical representations have themselves often been directly applied by engineers.

This has not been the case to date with semigroup theory.

This paper studies procedures for establishing numerical representations of finitely generated free semigroups derived from them. The representations discovered have a deep relationship with several powerful branches of mathematics, including number theory and linear algebra. So intimate is the relationship between digital data and these numerical representations that their practical consequences can be immediately grasped and indeed offer the basis for alternate technologies for the information industries and sciences.

INTRODUCTION

For semigroups S and T any morphism from S to T is a representation of S in T. A morphism from S to the full transformation semigroup on S of all self maps under composition, exists for all semigroups S. If S can be defined from some generating set X a representation can be found in $F_X$ the free semigroup on X comprising all finite words over X under concatenation.

It is here proposed to seek the representation of the non commutative properties of concatenation of uninterpreted symbols with objects derived from the commutative number systems. The strategy is to exploit the fact that the semigroup of endomorphisms of the direct product of commutative semigroups under composition is not in general commutative.

Preliminary results and the definitions and notation employed throughout are developed in Section I. Examples of the processes proposed are developed in Sections II and III and extended to finitely presented Semigroups in Section IV. Section V is less formal and provides an example of application to encryption.

SECTION I

Throughout $\bigcirc$ is an associative operation and $\circ$ is reserved for composition. The semigroup $(S,\bigcirc)$ is denoted by S when the product is understood. Products $a\bigcirc b$ are abbreviated to ab.

Function composition is written left to right to be consistent with other products so $\alpha\beta$ means first $\alpha$ then $\beta$.

As associativity allows products of any length to be written without the brackets, notation based on $\Pi$ is used for extended products. If S has further structure by virtue of closure under another binary operation additive notation is employed where ambiguity is reduced and where convenient or usual. A semigroup with an identity element is a monoid. A semigroup S, if not a monoid, having adjoined a new symbol, 1, with the property that 1a=a1=a for all a in $S\cup\{1\}$ is the monoid denoted by $S^1$. If S is a monoid $S^1$=S. Similarly $S^0$ denotes the semigroup with an adjoined zero element 0, if S does not possess a zero; otherwise $S^0$=S. By convention, S must have at least two elements to possess a zero.

$\mathbb{N}$ is used for the natural numbers (1,2 ...) and $\overline{\mathbb{N}}$ for $\mathbb{N}\cup\{0\}=\{0,1,2 \ldots\}$.

A homomorphism $\alpha\colon S\to T$ is a mapping from a semigroup S into a semigroup T such that $(ab)\alpha=a\alpha b\alpha$ for all a,b in S.

An anti-homomorphism $\alpha$ from a semigroup S to another semigroup T is a mapping which reverses multiplication in that $(ab)\alpha=b\alpha a\alpha(a,b\in)$.

If X is a non-empty set, denote by $F_X$ or F(X) the set of all non-empty finite words $x_1x_2\ldots x_0$ in the alphabet X under the operation of concatenation. The semigroup $F_X$, and an embedding of X into $F_X$ where each $x\in X$ is the corresponding one-letter word x in $F_X$, form the free semigroup on X. Any two free semigroups on base sets of equal order are isomorphic. The finitely generated free semigroup on a finite set of n elements, $F_n$ is taken here to be particularised as the set of symbols 0,1,...,n-1 under finite concatenation with the embedding of symbols 0,1,...,n-1 into $F_n$ as the words of unit length. For convenience the symbols will also be treated as the integers 0,1,...,n-1 without specifying the mapping by which this is achieved. Where it is required to distinguish the alphabet $\{0,1,\ldots,n-1\}$ from the semigroup $F_n$, $L_n$ is used, so that $F_n$=F($L_n$) in a common notation.

For a word x of a free semigroup written with exponents let spine of x or sp(x) denote the word derived from x by setting exponents greater than 1 to 1, and the exponents of x or ex(x) denote the m-tuple, m=|sp(x)|, with the $i^{th}$ component equal to the $i_{th}$ exponent in x. For example $sp(ab^3a^2c)$ =abac, $ex(ab_3a^2c)$=1,3,2,1 sp(abac)=abac, ex(abac)=1,1,1,1.

If X is a set, a multi set chosen from X is a function m from X into N. For example {a,a,b,b,b,d} denotes the multiset with X={a,b,c,d,e} and m(a)=2, m(b)=3, m(c)=0, m(d)=1, m(e)=0.

Words in $F_n$ can be viewed as walks in the complete graph $K_n$ augmented so that each vertex has a single loop. Setting the vertex set to be $L_n$ allows the edges to represent adjacent symbols in a free word, that is the edges are a subset of $L_n \times L_n$ derived by taking a,b to be the same edge as b,a of $(n^2+n)/2$ edges. If loops are omitted only the spine of a word can be represented.

As $K_n$ has no parallel edges a walk can be specified by a vertex sequence, eg. (1,3)(3,3)(3,0)(0,2) is an unambiguous representation of the word 13302.

If edge sequences are used to represent free words then the appropriate graph is the digraph derived from $K_n$ by replacing each edge with a pair of parallel arcs of opposite orientation.

SECTION II

Given a standard embedding of X into $F_X$, if X is a generating set for a semigroup S then for any map $\phi: X \to S$ and the map $\psi: F_X \to S$ defined by $(x_1 x_2 \ldots x_n)\psi = x_1 \phi_2 \phi \ldots x_n \phi$ then S is isomorphic to $F_X / \rho$ where $\rho$ is the relation $\psi \circ \psi^{-1}$. If X is finite and $\rho$ can be generated by a finite set $R = \{(w_1, z_1), \ldots, (w_m, z_m)\}$ of elements $(w_i, z_i) \in F_X \times F_X$, $F_X / \rho$ is finitely presented and $F_X / \rho = (x_1, x_2 \ldots x_n | w_1 = z_1 \ldots w_m = z_m)$, that is $F_X / \rho$ has generators $x_1, x_2 \ldots x_n$ and relations $w_1 = z_1 \ldots w_m = z_m$. A semigroup presentation with generating set X and relation set R is denoted by (X;R), and the corresponding semigroup by (X;R). Adjoining the empty string $\Lambda$ to $F_X$ provides $F_{X1}$, the free monoid on X. Monoid presentations include relations of the form w=1.

If X is a countable set and $x, y \in F(X)$ then S is said to satisfy x=y if $x\phi = y\phi$ for every homomorphism $\phi: F(X) \to S$. Elements of X are regarded as variables and the words x and y are to yield equal members of S for every possible assignment of values of S to the variables. For example a free inverse semigroup satisfies either of the following systems of identities (a) $x = xx^{-1}x$, $(x^{-1})^{-1} = x$, $x^{-1}xy^{-1} = y^{-1}yx^{-1}x$;

(b) $x = xx^{-1}x$, $(x^{-1})^{-1} = x$, $(xy)^{-1} = y^{-1}x^{-1}$, $xx^{-1}x^{-1}x = x^{-1}xxx^{-1}$.

Free inverse semigroups are known not to be finitely presented. (Schein 1963).

Here we consider semigroups with finite generating sets with elements from the set of endomorphisms of some background structure. Unless indicated otherwise, for a set of n endomorphisms $\{\beta_0, \ldots, \beta_{n-1}\}$ the embedding into $F_n$ with $\beta_i \mapsto i$ is assumed.

When functions are defined on sets for which they are automorphisms the existence of unique inverses allows for the representation of finitely presented semigroups. Relations can be treated as the (optional) insertion of the inverse of one side of an identity followed by the equivalent composition with the other.

For example in the semigroup (a,b,c,d;ab=c) the word acbab could be treated as $ac(c^{-1}ab)bab(b^{-1}a^{-1})c = aabbc$.

The representation of relations is developed in Section IV.

Considering the systems of identities for free inverse semigroups it can be seen that if words are inverse free no identity applies. The following characterisation of the free inverse semigroup on a set X, denoted by $FI_X$ due to Higgins (1992) explicitly partitions elements of X from their inverses as follows.

Let X be a non-empty set and let 1 be a bijection of X to a disjoint set X'. Consider the free semigroup $F_Y$ on $Y = X \cup X'$.

Define on $F_Y$ a unary operation $(\cdot^{-1})$ whereby $$y^{-1} = \begin{cases} x' & \text{if } y = x \in X, \\ x & \text{if } y = x' \in X', \end{cases}$$

and $$(x_1 x_2 \ldots x_n)' = x_n' x_{n-1}' \ldots x_1', \; x_i \in Y.$$

Now let $\rho$ be the congruence on $F_Y$ generated by $$\{yy'y, y | y \in F_Y\} \cup \{yy'zz', zz'yy' | y, z \in F_Y\}.$$

$$FI_X = (F_Y / \rho, i) \text{ where } i = \rho \!\restriction\! X.$$

Given a set X the construction of $FI_X$ provides $F_X$ and $F_{X'}$, and an involution $\alpha$ on their union. All that is wanted here is that for words x,y in $F_X$ or $F_{X'}$, $|xy| = |x| + |y|$, which does not hold in general in $FI_X$. The groups and semigroups required for the construction of number systems can be developed within this context. As it turns out there are numerical representations for free semigroups in sets of numerical objects equipped with a single operation. For this reason endomorphisms of semigroups rather than rings are emphasised. Recourse to structures with several operations only occurs when non linear morphs are considered.

Let $\{\beta_1, \ldots, \beta_n\}$ be a set of endomorphisms on a set X.

An enumeration of freely written products of $F(\{\beta_1, \ldots, \beta_n\})$ ordered by length for fixed n 1 $\beta_1, \beta_2, \ldots, p_{i,1} = \beta_i, \ldots, \beta_n$ 2 $\beta_1\beta_1, \beta_1\beta_2, \ldots, \beta_1\beta_i, \ldots, \beta_1\beta_n, \beta_2\beta_1, \ldots, p_{i,2}, \ldots, \beta_n\beta_n$

.
.
.

$k$ $\beta_1^k, \beta_1^{k-1}\beta_2, \ldots \beta_1^{k-1}\beta_n, \beta_1^{k-2}\beta_2\beta_1, \ldots, p_{i,k}, \ldots, \beta_1^k$ $l = n^k$ can be compared with one in which each term is replaced by the function defined by composition of functions with the order in which the products are taken strictly preserving the order in that term, that is elements of $(\{\beta_1, \ldots, \beta_n\}, \circ)$. Using $p_{i,k}$ for the $i^{th}$ free product of length k and $b_{i,k}$ for the corresponding function, the corresponding enumeration takes the form $b_{1,1}, b_{2,1}, \ldots, b_{i,1}, \ldots b_{n,1}$ $b_{1,2}, b_{2,2}, \ldots, b_{i,2}, \ldots, b_{n^2,2}$

.
.
.

$b_{1,k}, b_{2,k}, \ldots, b_{i,k}, \ldots, b_{l,k}$ $1 = n^k$ and note for the purpose of induction arguments that each term at length k gives rise to n terms at length k+1 hence the notation $b_{(i,j),k}$ for the function that results from the composition $b_{i,k}\beta_j$.

If the functions $\beta_1 \ldots \beta_n$ are distinct, that is $\beta_i = \beta_j$ if and only if i=j then an enumeration of freely written products is an enumeration of $F_n$, the free semigroup over n symbols. If the resulting functions are also distinct, that is $b_{i,k} = b_{j,l}$ if and only if i=j and k=l the bijection necessarily implied is here termed a labelling of $F_n$. If the elements of X can be treated as variables over objects over some number system then the term numerical labelling will be used. If there exists a factorisation algorithm for each label $b_{i,k}$ which enables the recovery of the free product $p_{i,k}$ the labelling is termed an encoding and the factorisation is a decoding, and a numerical encoding (decoding) if the labelling is numerical.

If $b_{i,k} \circ b_{j,l} = b_{n(i-1)+j,k+l}$ for all $i,j,k,l > 1$ then the encoding is a (numerical) representation.

For a free inverse semigroup $FI_X$ let S denote either $F_X$ or $F_X'$. S can be rendered commutative by the addition of the identity ab=ba.

Let $(A_n, \circ)$ be the semigroup generated by the set of n functions $\{a_i, \ldots, \alpha_n\} \subset \mathscr{E}(S^n)$, n>1, of which the $i^{th}$ function is defined by $$(a_1, a_2 \ldots a_i \ldots a_n)\alpha_i = (a'_1, a'_2 \ldots a'_i \ldots a'_n)$$

$$a'_j a_j a_i, \; i \neq j$$

$$a'_i = a_i.$$

Let $(B_n, \circ)$ be the semigroup generated by the set of n functions $\{\beta_1, \ldots, \beta_n\}, \subset \mathscr{E}(S^n)$, n>1 of which the $i^{th}$ function is defined by $$(a_1, a_2 \ldots a_i \ldots a_n)\beta_i = (a'_1, a'_2 \ldots a'_i \ldots a'_n)$$

with $$a'_i = \prod_{j=1}^{n} a_j$$

$$a'_j = a_j.$$

Proposition 2.1

When S is commutative the semigroups $A_n$ and $B_n$, n>1, are noncommutative and the sets $\{(\alpha_1, \ldots, \alpha_n)\}$, $\{\beta_1, \ldots, \beta_n\}$ are anticommutative.

Proof: If S is noncommutative there is little to prove.

Assume S is a commutative. For arbitrary integers $i, j, l \leq i$, $j \leq n$, $i \neq j$ compare the products $\alpha_i \alpha_j$ and $\alpha_j \alpha_i$.

$$(a_1, a_2, \ldots, a_i, \ldots, a_j, \ldots, a_n)\alpha_i\alpha_j =$$

$$(a_1 a_i, a_2 a_i, \ldots, a_i, \ldots, a_j a_i, \ldots, a_n a_i)\alpha_j =$$

$$a_1 a_i^2 a_j, a_2 a_i^2 a_j, \ldots, a_i^2 a_j, \ldots, a_j a_i, \ldots, a_n a_i^2 a_j$$

$$(a_1, a_2, \ldots, a_i, \ldots, a_j, \ldots, a_n)\alpha_j\alpha_i =$$

$$(a_1 a_j, a_2 a_j, \ldots, a_i a_j, \ldots, a_j, \ldots, a_n a_j)\alpha_i =$$

$$a_1 a_i a_j^2, a_2 a_i a_j^2, \ldots, a_i a_j, \ldots, a_i a_j^2, \ldots, a_n a_i a_j^2$$

$$\alpha_i \alpha_j \neq \alpha_j \alpha_i.$$

For $\beta_i \beta_j$ and $\beta_j \beta_i$ $$(a_1, a_2, \ldots, a_i, \ldots, a_j, \ldots, a_n) \beta_i \beta_j =$$

$$\left( a_1, a_2, \ldots, \prod_{k=1}^{n} a_k, \ldots, a_j, \ldots, a_n \right) \beta_j =$$

$$a_1, a_2, \ldots, \prod_{k=1}^{n} a_k, \ldots, a_j, \ldots, a_n$$

$$a_j = \left( \prod_{k=1}^{n} a_k \right) \left( \prod_{\substack{k=1 \\ k \neq i}}^{n} a_k \right)$$

$$(a_1, a_2, \ldots, a_i, \ldots, a_j, \ldots, a_n) \beta_j \beta_i =$$

$$\left( a_1, a_2, \ldots, a_i, \ldots, \prod_{k=1}^{n} a_k, \ldots, a_n \right) \beta_i =$$

$$a_1, a_2, \ldots, a_i, \ldots, \prod_{k=1}^{n} a_k, \ldots, a_n$$

$$a_i = \left( \prod_{k=1}^{n} a_k \right) \left( \prod_{\substack{k=1 \\ k \neq j}}^{n} a_k \right)$$

$$\beta_i \beta_j \neq \beta_j \beta_i.$$

Let $C_n \subset \mathscr{E}(<S>^n)$ be the semigroup generated by the set of functions $\gamma_1, \gamma_2 \ldots \gamma_i \ldots \gamma_n$, n>1 of which the $i^{th}$ is defined by $$(a_1, a_2 \ldots a_i \ldots a_n)\gamma_i = (a'_1, a'_2 \ldots a'_i \ldots a'_n)$$

$$a'_j = a_j \text{ for } j \neq i$$

$$a'_i = a_i b \text{ where } b \text{ is an } a_j \text{ such that}$$

$$g(b) = \sup(\{g(a_j)\} \setminus \{g(a_i)\}).$$

Proposition 2.2

The semigroup $C_n$ generated by $\{\gamma_1, \ldots, \gamma_n\}$, n>1, is strictly noncommutative.

Proof: Since monogenic semigroups are commutative, calculation of product of compositions takes the form $$(a_1, \ldots, a_i, \ldots, a_j, \ldots, a_n)\gamma_i\gamma_j =$$

$$(b_1, \ldots, b_n) = (a_1, \ldots, a_i, s, \ldots, a_j, \ldots a_n)\gamma_j$$

with s any $a_k$, $k \neq i$ for which $g(a^k) = \sup(\{g(a_1)\} \setminus \{g(a_i)\})$, $1 \leq l \leq n$.

$$= a_1, \ldots, a_i b, \ldots, a_j a_i b, \ldots, a_n$$

with $g(l_j)$ strictly greater than $g(b_k)$, $k \neq j$.

Similarly $(a_1, \ldots, a_n)\gamma_j\gamma_i = (b_1, \ldots, b_n)$ with $g(b_i)$ strictly greater than g for any other entry, hence $\gamma_i\gamma_j \neq \gamma_j\gamma_i$, $i \neq j$.

A function $g: F_n \to \mathbb{N}$ with $g(xy) = g(x) + g(y)$ can be defined for the free products by setting $g(x) = |x|$, the length of the word x.

Extension of g to the objects $b_{i,j}$ which result from performing functional composition can be justified when the generators $\beta_1 \ldots \beta_n$ form a set of irreducible elements under that operation, in which case the length $\lambda(a)$ defined by $\lambda(a) = k$ if $a = p_1 p_2 \ldots p_i \ldots p_k$, $p_i$ in $\{\beta_1, \ldots \beta_n\}$. If a unit (identity function) $\beta_0$ is adjoined set $\lambda(\beta_0) = 0$. Under these conditions $\lambda(a)$ is well defined and interchangeable with $|a|$. The examples of the next section can be readily seen to fulfil these conditions.

NUMERICAL REPRESENTATIONS

Consider the homomorphism $\sigma: (F_X)^n \to (\mathbb{N}, +)^n$ defined by $x_i \mapsto |x_i|$ for each component $x_j$ of $\underline{x} \in (F_X)^n$. For example $\tau = \alpha_1 \alpha_3 \alpha_2 \alpha_2 \alpha_4 \in A_5$ $$\underline{a} = a_1, a_2, a_3, a_4, a_5$$

$$\underline{a}\alpha_1 = a_1, a_1 a_2, a_1 a_3, a_1 a_4, a_1 a_5$$

$$\underline{a}\alpha_1\alpha_3 = a_1^2 a_3, a_1^2 a_2 a_3, a_1 a_3, a_1^2 a_3 a_4, a_1^2 a_3 a_5$$

$$\underline{a}\alpha_1\alpha_3\alpha_2 = a_1^4 a_2 a_3^2, a_1^2 a_2 a_3, a_1^3 a_2 a_3^2, a_1^4 a_2 a_3^2 a_4, a_1^4 a_2 a_3^2 a_5$$

$$\underline{a}\alpha_1\alpha_3\alpha_2\alpha_2 = a_1^6 a_2^2 a_3^3, a_1^2 a_2 a_3, a_1^5 a_2^2 a_3^3, a_1^6 a_2^2 a_3^3 a_4, a_1^6 a_2^2 a_3^3 a_5$$

-continued $\underline{a}\alpha_1\alpha_3\alpha_2\alpha_2\alpha_4 =$ $a_1^{12}a_2^4a_3^6a_4, a_1^8a_2^3a_3^4a_4, a_1^{11}a_2^4a_3^6a_4, a_1^6a_2^2a_3^3a_4, a_1^{12}a_2^4a_3^6a_4a_5 = \underline{a}\tau$ $\underline{a}\tau\sigma = 23, 16, 22, 12, 24$ when $|a_i| = 1$.

The natural numbers under addition is $F_1$, and commutative by virtue of being monogenic. The n-tuples over $\mathbb{N}$ that arise from this map can involve repeated values so that the concept of a multiset is useful.

The following properties of multi sets of nonzero positive real numbers, although too simple to require proof, are relied on hereafter. In this context 'supremum' and 'infimum' will be used to nominate a unique element of a set in which repeated values may occur, this usage is an analogy to the infinite case. Sup S, if it exists, is an element strictly greater than any other element of S, inf S, if it exists, is strictly less than any other. For example P={1,1,2,2} has neither a sup(P) nor inf(P) although minP=1 and maxP=2 and Q={1,2,2,3} has supQ=3, infQ=1, maxQ=3, minQ=1.

Let P and Q be multi sets of nonzero positive real numbers.

PQ1) If P' is constructed from P by selecting any element x and adding it to every element of P other than itself then x is the inf of P'.

PQ2) If P' is constructed from P by selecting an element x of P and forming x' from x by adding to it every element of P other than itself then x' is the supremum of P'.

PQ3) If P' is constructed from P by selecting any element x and forming x' by adding to x any element equal to the maximum of P then x' is the supremum of P'.

PQ4) If x is any element of P equal to the maximum of P and y any element of Q then if a set Q' is constructed from Q by replacing the element y with x+y then maxQ>maxP.

PQ5) If maxP≧maxQ then if x is any element of P with x=maxP and y is any element of Q then if Q' is constructed from Q by replacing the element y with x+y then that element is the supremum of Q', that is supQ'=x+y.

Let S be a semigroup and t be an automorphism on S. The pair <S,t> will be said to have the PQ property if there exists a function $g:S \to \mathbb{R}^+$ such that for all a,b in S g(ab)>g(a) and g(ab)>b.

For $\underline{a} \in \mathbb{N}^n$ denote by $\{\underline{a}\}$ the multiset from the components of $\underline{a}$ and $\{\underline{a}\} - a_i$ for the multiset from the components of $\underline{a}$ other than the $i^{th}$.

The transformation $\underline{a}\alpha_i$ leaves $a_j'\sigma < a_j'\sigma$, $j \neq i$. The transformation $\underline{a}\beta_i$ results in $a_j'\sigma > a_j'\sigma$, $i \neq j$. Given that $\underline{a}\sigma\alpha_i$ has been performed it follows that i can be determined simply by determining which component of $\underline{a}'$ has the least value. Similarly given that $\underline{a}\sigma\beta_i$ has been performed i can be determined by locating the component of $\underline{a}'$ with the greatest value. This mechanism can be exploited to define tests for divisibility.

Let $\tau \in A_n$ and $\underline{a} = 1_n \tau\sigma$ then $\tau$ is of the form $\tau'\alpha_i$ if and only if $a_i = \inf\{\underline{a}\}$.

If $\tau \in B_n$ and $\underline{a} = 1_n \tau\sigma$ then $\tau$ is of the form $\tau'\beta_i$ if and only if $a_i = \sup\{\underline{a}\}$.

Given as an algorithm for recovery of the sequences of generators of $A_n$ that have acted on $\underline{a}$.

EXAMPLE a=1 1 1 1 1

Performing $\underline{a}\alpha_1\alpha_3\alpha_2\alpha_2\alpha_4$ $\underline{a}\alpha_1=1,2,2,2,2$ $\underline{a}\alpha_1\alpha_3=3,4,2,4,4$ $\underline{a}\alpha_1\alpha_3\alpha_2=7,4,6,8,8$ $\underline{a}\alpha_1\alpha_3\alpha_2\alpha_2=11,4,10,12,12$ $\underline{a}\alpha_1\alpha_3\alpha_2\alpha_2\alpha_4=23,16,22,12,24$ EXAMPLE $\underline{a}$=1,1,1,1,1

$\tau = \beta_1\beta_3\beta_2\beta_2\beta_4 \in B_5$

Performing $\underline{a}\beta_1\beta_3\beta_2\beta_2\beta_4$ $\underline{a}\beta_1=5,1,1,1,1$ $\underline{a}\beta_1\beta_3=5,1,9,1,1$ $\underline{a}\beta_1\beta_3\beta_2=5,17,9,1,1$ $\underline{a}\beta_1\beta_3\beta_2\beta_2=5,33,9,1,1$ $\underline{a}\beta_1\beta_3\beta_2\beta_2\beta_4=5,33,9,49,1$ The existence of unambiguous tests for divisibility of $\alpha_i$ and $\beta_i$ is sufficient to give the result.

Theorem: For all n>1, $A_n \backsimeq F_n$ and $B_n \backsimeq F_n$.

Other semigroups of automorphisms will be shown to be isomorphic to $F_n$ however it is not sufficient to isolate sets of generators that are anticommutative as the following example shows.

For $\underline{a}$=a,b,c and $\{\theta_1, \theta_2, \theta_3\}$, an anticommutative set of automorphisms defined by $\underline{a}\theta_1 = a,ba,c$ $\underline{a}\theta_2 = (a,b,c)\theta_2 = a,b,cb$ $\underline{a}\theta_3 = (a,b,c)\theta_3 = ac,b,c.$ Calculating $\underline{a}\theta_1\theta_2\theta_2\theta_1$ yields $\underline{a}\alpha = a,ba,c$ $\underline{a}\theta_1\theta_2 = a,ba,cba$ $\underline{a}\theta_1\theta_2\theta_2 = a,ba,cbaba$ $\underline{a}\theta_1\theta_2\theta_2\theta_1 = a,bab,cbaba$ Calculating $\underline{a}\theta_2\theta_1\theta_1\theta_2$ yields $\underline{a}\theta_2 = a,b,cb$ $\underline{a}\theta_2\theta_1 = a,ba,cb$ $\underline{a}\theta_2\theta_1\theta_1 = a,baa,cb$ $\underline{a}\theta_{21}\theta_1\theta_2 = a,baa,cbbaa$ so that $\underline{a}\theta_1\theta_2\theta_2\theta_1 \neq \theta_2\theta_1\theta_1\theta_2$, however when $\{a,b,c\}$ commutes $\underline{a}\theta_1\theta_2\theta_2\theta_1 = \underline{a}\theta_2\theta_1\theta_1\theta_2 = a, a^2b, a^2b^2c.$ Define functions $\gamma_i$, $1 \leq i \leq n$, by $a_j' = a_j$  $j \neq i$ $a_i' = a_i + \max\{\underline{a}\} - a_i.$ Let $G_n$ be the semigroup generated by $\{\gamma_1, \ldots \gamma_n\}$.

It is central to what follows to observe that after performing $\underline{a}\gamma_i$ the component $a_i'$ is the sup $\{\underline{a}\}$.

EXAMPLE $\underline{a}=1,1,1,1,1$

Performing $\underline{a}\gamma_1\gamma_3\gamma_2\gamma_2\gamma_4$

| | | |
|---|---|---|
| max | $\{\underline{a}\} - a_1 = 1$ | |
| | $\underline{a}\gamma_1 = 2, 1, 1, 1, 1$ | $sup\ \{\underline{a}\gamma_1\} = a_1'$ |
| max | $\{\underline{a}\gamma_1\} - a_3 = 2$ | |
| | $\underline{a}\gamma_1\gamma_3 = 2, 1, 3, 1, 1$ | $sup\ \{\underline{a}\gamma_1\gamma_3\} = a_3'$ |
| max | $\{\underline{a}\gamma_1\gamma_3\} - a_2 = 3$ | |
| | $\underline{a}\gamma_1\gamma_3\gamma_2 = 2, 4, 3, 1, 1$ | $sup\ \{\underline{a}\gamma_1\gamma_3\gamma_2\} = a_2'$ |
| max | $\{\underline{a}\gamma_1\gamma_3\gamma_2\} - a_2 = 3$ | |
| | $\underline{a}\gamma_1\gamma_3\gamma_2\gamma_2 = 2, 7, 3, 1, 1$ | $sup\ \{\underline{a}\gamma_1\gamma_3\gamma_2\gamma_2\} = a_2'$ |
| max | $\{\underline{a}\gamma_1\gamma_3\gamma_2\gamma_2\} - a_4 = 7$ | |
| | $\underline{a}\gamma_1\gamma_3\gamma_2\gamma_2\gamma_4 = 2, 7, 3, 8, 1$ | $sup\ \{\underline{a}\gamma_1\gamma_3\gamma_2\gamma_2\gamma_4\} = a_4'$. |

Set $\underline{b} = \underline{a}\gamma_1\gamma_3\gamma_2\gamma_2\gamma_4 = 2,7,3,8,1$.

Given that $\underline{b}=\underline{a}\tau$, $\tau \in G_n$ then $\tau$ can be recovered from $\underline{b}$ because determination of i for which $b_i = \sup\{\underline{b}\}$ is unambiguous and is a test for (post) divisibility by $\gamma_i$ and $\gamma_i^{-1}$ is well defined by $$(b_1, \ldots b_n)\gamma_i^{-1} = \underline{b}'$$
$$b_j' = b_j\ j \neq i$$
$$b_i' = b_1 - \sup\{\underline{b}\} - b_i.$$

Given as an algorithm recovery of the sequences of generators of $G_n$ that have acted on $\underline{a}$ becomes Step 1. Accept $\underline{b}$
Step 2. If $b_i$ is the $\sup\{\underline{b}\}$ emit i
Step 3. Set $b_i = b_i - \sup\{\underline{b}\} - b_i$
Step 4. If $\underline{b} \neq \underline{a}$ go to Step 2 else end.

The output sequence of integers clearly index the functions $\gamma_i$ in reverse order to their application. However assume an embedding of the generators $\{\gamma_1, \ldots \gamma_n\}$ of $G_n$ into $F_n$ having particularised $F_n$ as sequences on the alphabet $\{0, 1 \ldots n-1\}$.

The algorithm given, modified at Step 2 to read "emit i−1" now emits sequences in $F_n$.

Again with this embedding in mind the procedure for performing $\underline{a}\tau$ can be given in terms of elements of $F_n$, as an algorithm.

Step 1. Accept $x = x_1 \ldots x_{|x|} \in F_n$
Step 2. Set $\underline{a} = 1_n$, $i = 1$
Step 3. Set $a_j = a_j + \max\{\underline{a}\} - a_j$
where $j = x_i + 1$
set $i = i + 1$
Step 4. If $|x|$ then end, else go to Step 3.

The unique factorisation algorithm for $\tau$ in $G_n$ is sufficient to justify the following.

Theorem 2.1 For $n > 1$ $G_n$ is isomorphic to $F_n$.

Several systems of automorphism have now been shown to be isomorphic to finitely generated free semigroups. These are now developed into encoding and decoding procedures by defining encoding and decoding functions.

Hereafter the n automorphisms generating a semigroup are indexed $0, \ldots, n-1$ and $\Gamma_n = \{\theta_0, \ldots \theta_{n-1}\}$ is generic for the several semigroups so generated and shown to be isomorphic to $F_n$.

An encoding function is a function $e: \mathbb{N}^n, i \to \mathbb{N}^n$ defined by $\underline{a}, i \mapsto \underline{a}\theta_i$ with $\underline{a}$ in $\mathbb{N}^n$ where i is a symbol from the particularisation of $F_n$ as $F(\{1, \ldots, i, \ldots, n-1\})$ with e extended to $F_n$ by $$e(\underline{a}, x) = e(\ldots (e(e(\underline{a}, x_1), x_2) \ldots )x_n)$$
$$x = x_1 \ldots x_n \in F_n, x_i \text{ in } \{0, \ldots, n-1\}.$$

An anti-encoding for $x = x_1 \ldots x_n$ can be defined by $$e(\underline{a}, x) = e(\ldots e(e(\underline{a}, x_n)x_{n-1} \ldots )x_1).$$

Let $E(\underline{a}) \subset \mathbb{N}^n$ defined by $y \in E(\underline{a}) \to y = e(\underline{a}, x)$ for some word x in $F_n$. A decoding function $d: E(\underline{a}) \to \{0, \ldots, n-1\}$ defined by $d(\underline{b}) \mapsto \underline{b}\theta_i^{-1}$, i where $\underline{b} \in E(\underline{a})$ and i is selected by a divisibility test defined in $\Gamma_n$ and extended by repeated application until $\underline{b}' = \underline{a}$.

An encoding function is fully specified when n, $\Gamma_n$, $\phi: \{\theta_0, \ldots, \theta_{n-1}\} \to \{0, \ldots, n-1\}$ and $\underline{a}$ are fixed. Hereafter a standard encoding over $\Gamma_n$ will be the encoding function with $\underline{a} = 1_n$, $\phi$ defined by $\theta_a \mapsto i$.

Denote by $R_n$, $n > 1$ the set of relative prime n-tuples in $(\mathbb{N}^0)^n$.

When $n=2$, $R_2$ can be identified as $Q^+$ the positive rational numbers.

Assigning a highest common factor to pairs of integers defines an associative, commutative binary operation under which the positive integers are closed. In the resultant semigroup the integer 1 acts as a zero as $(1,x)=1$ for all x in Z so that $1x = x1 = 1$. By setting $(0,x) = x$, 0 acts as the identity since the implied product is $0x = x0 = x$ for all x in Z. Denote by H the monoid with zero of $\mathbb{N}^0$ under this operation. The sets $R_n$ above can be defined as the set of free words w of length n in H with $w=1$. If addition is allowed in H the operations interact by the identity $a(a+b) = ab$ reflecting that $(a,b) = (a, a+b)$. As a consequence the standard encodings of $F_n$ from $1_n$ over $A_n$, $B_n$ and $C_n$ are surjections into $R_n$.

The homomorphism $\sigma: (F_X)^n \to (\mathbb{N}, +)^n$ with $x_i \mapsto |x_i|$ will be termed 'standard'.

The sets of automorphisms $A_n$ and $B_n$ are readily seen to be linear transforms, their matrix representation is treated in the next section. The transforms of $C_n$ must be redefined to make linearity apparent in a manner suitable for matrix representation.

Let $D_n \subset \text{Aut}(\mathbb{N}^n)$ be the set of $n^2 - n$ functions $\delta_{ijpb}$, $1 \leq i, j \leq n$, $i \neq j$ of which the i,j$^{th}$ is given by $$(a_1, \ldots, a_i, \ldots, a_j, \ldots a_n)\delta_{ij} = (a_1, \ldots, a_i, \ldots, a_j', \ldots a_n)$$

where $a_j' = a_i + a_j$. Functions $\delta_{i,j}$ and $\delta_{k,l}$ commute if and only if $j \neq k$ and $i \neq l$.

Informally $D_n$ will be used to represent the transitions between symbols in free words and vertices of graphs.

Let $G_n$ be the semigroup on $\{i,j | 1 \leq i, j \leq \} \cup \{0\}$ with a product defined by $(i,j)(k,l) = 0$ if $j \neq k$ else $(i,l)$.

As 0 acts as a zero in $T_n$ any word $x = x_i \ldots x_n$, $x_i = (j_i, k_i)$ in which $x_i x_{i+1} = (j_i, k_i)(j_{i+1}, k_{i+1})$ with $k_i \neq j_{i+1}$ occurs is identically 0.

Denote by $N(T_n)$ the set of nonzero words of $F(T_n)$. Clearly $N(T_n)$ is not closed under the product of $T_n$. However there is a bijection between $N(T_n)$ and $F_n$, constructed as follows.

1) Given $x \in F_n$, $x = x_1 \ldots x_n$ form the word $x_0 \text{sp}(x)$ where $x_0$ is a symbol in the alphabet for $F_n$, $x_0 \neq x_1$. A suitable rule for selecting $x_0$ given the alphabet $0, \ldots, n-1$ is; set $X_0 = (X_1 + L) \mod L$. For example $x = 0^3 1^2 2^1 0^2$ x' is 10120.

2) Construct the sequence of pairs $p = p_1, \ldots, p_n$, $p_1 = x_i'$, $x_{i-1}'$ m=|x|. For the example $p = (1,0)(0,1)(1,2)(2,0)$.

3) Construct the word y in $D_n$ $y=y_1^{e1} \ldots y_m^{em}$ with $y_i = \delta_{pi}^{ei}$, ei the $i^{th}$ component of exp(x). For the example $0^3 1^2 2^1 0^2 \mapsto \delta_{1,0}^3 \delta_{0,1}^2 \delta_{1,2} \delta_{2,0}^2$.

Define the mapping $\tau_n:[n]x[n] \to E_{ij}$ of the integer pairs (i,j), $0 \leq i, j \leq n-1$ into the elementary matrices of order n by taking $\tau(i,j)$ to be the n-square matrix with the entries of the major diagonal set to 1 and the $i,j^{th}$ entry set to 1. If i=j the map is to the identity matrix of order n. The range of $\tau$ is the elementary matrices $E_n$ of order n which act on an arbitrary n×m matrix so that $E_{ij}$ X, i≠j, is derived from X by adding the $j^{th}$ row to the $i^{th}$ row. Products in $E_n$, $E_{ij}I_{kl}$ commute if and only if j≠k or i≠l. By mapping $\delta_{ij} \mapsto E_{ij}$ a matrix representation that provides a numerical encoding equivalent to $C_n$ is achieved. The resulting expression for the free product can be interpreted as representing the transition, left to right, between successive symbols of x.

In the encoding and decoding procedures described the components of a act as variables. The initialisation for enoding could be reworded "set variables $a_1, \ldots, a_n$ to 1." So viewed the encodings treated above involve n variables for $F_n$. By disengaging the number of variables from the order of the alphabet it is possible to associate encoding of $F_n$ with walks on a digraph of m vertices, $m \leq n$.

To generate a numerical representation of a particular finite state transducer assume that 1. a function T:Q×S→Q of states by (input) symbols to states from which is derived 2. a function Q×S→O of states by input symbols to output symbols is given either explicitly (by tables) or implicitly by some rule (eg. $T(q_c, s_i) = q_i$).

Take Q to be a set of q states $q_1, \ldots, q_q$ one of which is a designated start state $q_0$ and S to contain s symbols $s_1, \ldots, s_s$.

Set Q to be a set of q variables $q_1, \ldots, q_q$ initially set to some nonzero value, d is a variable not in Q initialised to the initial value of the variable corresponding to the start state.

On accepting the first input symbol set the variable corresponding to $T(q_0, x_1)$ to $T(q_0, x_1)d$. For each input thereafter set $T(q_c, x_i) = T(q_c, x_i)d$.

The value of d is changed when $T(q_c, x_i) \neq q_c$, $q_c$ being the current state, is set to the value of the variable corresponding to $q_c$.

SECTION III

Denote by $M_n$ the semigroup comprising all n-square matrices of determinant 1 over $\mathbb{N}^0$, excluding the identity matrix of order n, under matrix multiplication. When the identity element $I_n$ is to be included the resulting monoid is denoted by $M_n^1$.

Define the mapping $\tau_n:[n]×[n] \to E_{ij}$ of the integer pairs (i,j), i,j≤1≤n into the elementary matrices of order n by taking $\tau(i,j)$ to be the n-square matrix with entries of the major diagonal set to 1 and the $i,j^{th}$ entry set to 1. If i=j the map is to the identity matrix of order n.

Denote by $E_n^1$ the monoid generated by the $n^2-n+1$, n-square matrices of determinant 1 determined by $\tau_n$, $E_n$ when the identity is excluded. Enumeration for $E_n$ takes the form $n=2$  1 1  1 0
       0 1  1 1

$n=3$  1 1 0  1 0 1  1 0 0  1 0 0  1 0 0  1 0 0
       0 1 0  0 1 0  1 1 0  0 1 1  0 1 0  0 1 0
       0 0 1  0 0 1  0 0 1  0 1 1  1 0 1  0 1 1
       .
       .
       .

Denote by $A_n$ the semigroup generated by the n matrices, $A_{i,n}$ under matrix multiplication. Where $$A_{i,n} = \prod_{j=0}^{n-1} E_{i,j}$$

Enumeration for $A_n$ takes the form $n=2$  1 1  1 0
       1 0  1 1

$n=3$  1 1 1  1 0 0  1 0 0
       0 1 0  1 1 1  0 1 0
       0 0 1  0 0 1  1 1 1
       .
       .
       .

Denote by $B_n$ the semigroup generated by the n matrices $B_{i,n}$ under matrix multiplication, where $B_{k,n} = (A_{k,n})^T$.

Enumeration for $B_n$ takes the form $n=2$  1 0  1 1
       1 1  0 1

$n=3$  1 0 0  1 1 0  1 0 1
       1 1 0  0 1 0  0 1 1
       1 0 1  0 1 1  0 0 1
       .
       .
       .

Denote by $C_n$ the semigroup generated by the n matrices $C_{i,n}$ under matrix multiplication, where $$C_{i,n} = \prod_{j=0}^{m-1} E_{k,l}$$

$l = (i + j) \bmod n$ $k = (i + j + m) \bmod n$ $m = \left\lceil \dfrac{n}{2} \right\rceil.$ Enumeration for $C_n$ takes the form $n=2$  1 1  1 0
       0 1  1 1

$n=3$  1 0 1  1 0 0  1 0 1
       1 1 0  1 1 0  0 1 0
       0 0 1  0 1 1  0 1 1

-continued
```
n = 4   1 0 1 0   1 0 0 0   1 0 0 0   1 0 0 0
        0 1 0 1   0 1 0 1   0 1 0 0   0 1 0 0
        0 0 1 0   1 0 1 0   1 0 1 0   0 0 1 0
        0 0 0 1   0 0 0 1   0 1 0 1   0 1 0 1
```
.
.
.

$F_n \diamond A_n \diamond B_n \diamond C_n$ for all $n \geq 1$.

For the case n=2 then $$E_2 = A_2 = B_2 = C_2 = \left( \begin{bmatrix} 1 & 1 \\ 1 & 0 \end{bmatrix}, \begin{bmatrix} 1 & 0 \\ 1 & 1 \end{bmatrix}; \right).$$

Hence the binary case is distinguished and the semigroup $\{\alpha,\beta\}$, $$\{\alpha,\beta\}, \alpha = \begin{bmatrix} 1 & 1 \\ 0 & 1 \end{bmatrix}, \beta = \begin{bmatrix} 1 & 0 \\ 1 & 1 \end{bmatrix}$$

under matrix multiplication is hereafter denoted by B (without subscript).

Theorem: 3.2 If $Q^+$ is the set of ordered pairs of relatively prime positive integers and $M_2$ is the 2-square matrices of determinant 1 over $\mathbb{N}^0$ then the function $q:Q^+ \to M_2$ defined below is a bijection.

For (x,y) in $Q^+$ with x,y>1

$$q(x,y) = \begin{bmatrix} [y]_x^{-1} & [-y]_x^{-1} \\ [-x]_y & [x]_y \end{bmatrix}$$

Where $[n]_m^{-1}$ the unique integer k in the representative class 0 to m−1 for which $nk \equiv 1 \mod m$. For x=1 or y=1.

$$q(x,1) = \begin{bmatrix} 1 & x-1 \\ 0 & 1 \end{bmatrix}$$

$$q(1,y) = \begin{bmatrix} 1 & 0 \\ y-1 & 1 \end{bmatrix}.$$

Proof:
Recalling $[\alpha]_\beta^{-1}$ exists $\leftrightarrow (\alpha,\beta)=1$ and $[\alpha]_\beta^{-1} + [-\alpha]_\beta^{-1} \beta$.

Injection: –

$$q(x,y) = q(u,v) = \begin{bmatrix} a & b \\ c & d \end{bmatrix}$$

$\Rightarrow [y]_x^{-1} + [-y]_x^{-1} = x = a + b$ and $[v]_u^{-1} + [-y]_x^{-1} = u = a + b$ $\Rightarrow x = u.$ Similarly $[-x]_y^{-1} + [x]_y^{-1} = y = c + d$ and $[-u]_v^{-1} + [u]_v^{-1} = v = c + d$ $\Rightarrow y = v.$ Surjection: –

If $\begin{bmatrix} a & b \\ c & d \end{bmatrix}$ is in $M_2$ then $ab - bc = 1$ $\Rightarrow (a,b) = 1$ $\Rightarrow (a+b,b) = 1$ and $(a, a+b) = 1$ $\Rightarrow [a]_{a+b}^{-1}$ and $[b]_{a+b}^{-1}$ exist.

$b = -a \mod a + b$ $\Rightarrow [b]_{a+b}^{-1} = [-a]_{a+b}^{-1}$ $[a]_{a+b}^{-1} + [-a]_{a+b}^{-1} = a + b$ Similarly $[-d]_{c+d}^{-1} + [d]_{c+d}^{-1} = c + d$ Hence $\begin{bmatrix} a & b \\ c & d \end{bmatrix} = q(a+b, c+d)$.

Again from $ad - bc = 1$ $(a+b)(c+d) - bc = a(c+d) + bd$ and $(a+b)(c+d) - bc = c(a+b) + bd + 1$ $\Rightarrow a(c+d) - c(a+b) = 1$ $\Rightarrow a+b, c+d \in Q^+.$ This proof establishes that $r:M_2 \to Q^+$, $r = q^{-1}$ for $$A = \begin{bmatrix} a & b \\ c & d \end{bmatrix}$$

$r(A) = a+b, c+d$ or $$r(A) = A \begin{bmatrix} 1 \\ 1 \end{bmatrix}^T = (1,1)A^T.$$

EXAMPLE 3.2

$$q(3,7) = \begin{bmatrix} [7]_3^{-1} & [-7]_3^{-1} \\ [-3]_7^{-1} & [3]_7^{-1} \end{bmatrix} = \begin{bmatrix} [1]_3^{-1} & [2]_3^{-1} \\ [4]_7^{-1} & [3]_7^{-1} \end{bmatrix} =$$

$$q^{-1}\left( \begin{bmatrix} 1 & 2 \\ 2 & 5 \end{bmatrix} \right) = \begin{bmatrix} 1 & 2 \\ 2 & 5 \end{bmatrix} \begin{bmatrix} 1 \\ 1 \end{bmatrix}^T = \begin{bmatrix} 3 \\ 7 \end{bmatrix}^T = 3, 7.$$

Theorem 3.3: $M_2$ is generated by just two generators $$\alpha = \begin{bmatrix} 1 & 1 \\ 1 & 0 \end{bmatrix} \text{ and } \beta = \begin{bmatrix} 1 & 0 \\ 1 & 1 \end{bmatrix},$$

that is $M_2 = E_2$.

Proof: If $M_2$ is generated by $\{\alpha,\beta\}$ then for all $$A = \begin{bmatrix} a & b \\ c & d \end{bmatrix}$$

in $M_2$ $A \neq I_2$ and either $A\alpha^{-1} \in M_2$ or $A\beta^{-1} \in M_2$, $$\alpha^{-1} = \begin{bmatrix} 1 & -1 \\ 0 & 1 \end{bmatrix}, \beta^{-1} = \begin{bmatrix} 1 & 0 \\ -1 & 1 \end{bmatrix},$$

that is either $$\begin{bmatrix} a & b-a \\ c & d-c \end{bmatrix} \text{ or } \begin{bmatrix} a-b & b \\ c-d & d \end{bmatrix} \in M_2$$

Case 1. a=b or c=d.
a=b
ad−bc=1⇒(a,b)=1⇒b=1 and A is in the form $$\begin{bmatrix} 1 & 1 \\ n & n+1 \end{bmatrix}, n \in \mathbb{N}^0.$$

Similarly
c=d⇒A is in the form $$\begin{bmatrix} n+1 & n \\ 1 & 1 \end{bmatrix}$$

and $A\beta^{-1} \in M_2$.
Case 2. Neither a=b nor c=d.
ad−bc=1⇒a/(c+1/b)=b/d
b∈N ⇒1/b<1 hence
a>b ↔ c>d and
a<b ↔ c<d⇒ either $A\alpha^{-1}$ or $A\beta^{-1} \in M_2$ This result guarantees that matrices in $M_2$ can be rewritten as a finite sequence of the generators $\alpha$ and $\beta$. Moreover the divisibility test for (pre)division by generators has been shown to be exclusive, that division is always possible by either $\alpha$ or $\beta$ not both. These are the requirements for unique factorisation into sequences of the two generators up to and including order. A factorisation algorithm takes the form:
 if the sum of the top row is greater than the sum of the bottom row divisible by $\alpha$ else divisible by $\beta$ division is performed as follows
 if divisible by $\alpha$ subtract the top row from the bottom, for $\beta$ subtract the bottom row from the top. This process can be continued until the row sums are equal which can only occur for the identity.

The set of all finite sequences over $\{\alpha,\beta\}$ is just another name for $F_2$ and associativity guarantees that matrix multiplication in $M_2$ can be translated as concatenation in $F_2$.

These observations are collected as Theorem 3.4 $M_2 \Leftrightarrow F_2$.

The bijection of $M_2$ onto $Q^+$ can be used to induce a non commutative operation on positive real numbers in the obvious way. The circled multiplication ⊗ will be reserved for this operation defined by $$(a,b) \otimes (c,d) = q(r(a,b), r(c,d))$$

which can be computed directly in $Q^+$ by $$\frac{a}{b} \otimes \frac{c}{d} = \frac{ad + b*D}{bc - a^2 D}$$

where $b^1 = [b]_a^{-1}$, $a^1 = [a]_b^{-1}$, $D = c - d$. Consequently Theorem 3.5 $M_2 \Leftrightarrow (Q^+, \otimes) \Leftrightarrow F_2$.

Tables 3.1, 3.2 illustrate the relationship between rational numbers, matrices and generators.

TABLE 3.1

The mapping q of relative prime pairs a, b to square matrices over $\mathbb{N}^0$ of determinant 1 for a, b ≤ 10.

| | b | | | | | | | | | |
|---|---|---|---|---|---|---|---|---|---|---|
| | 1 | 2 | 3 | 4 | 5 | 6 | 7 | 8 | 9 | 10 |
| a | | | | | | | | | | |
| 1 | 1 0<br>0 1 | 1 0<br>1 1 | 1 0<br>2 1 | 1 0<br>3 1 | 1 0<br>4 1 | 1 0<br>5 1 | 1 0<br>6 1 | 1 0<br>7 1 | 1 0<br>8 1 | 1 0<br>9 1 |
| 2 | 1 1<br>0 1 | | 1 1<br>1 2 | | 1 1<br>2 3 | | 1 1<br>3 4 | | 1 1<br>4 5 | |
| 3 | 1 2<br>0 1 | 2 1<br>1 1 | | 1 2<br>1 3 | 2 1<br>3 2 | | 1 2<br>2 5 | 2 1<br>5 3 | | 1 2<br>3 7 |
| 4 | 1 3<br>0 1 | | 3 1<br>2 1 | | 1 3<br>1 4 | | 3 1<br>5 2 | | 1 3<br>2 7 | |
| 5 | 1 4<br>0 1 | 3 2<br>1 1 | 2 3<br>1 2 | 4 1<br>3 1 | | 1 4<br>1 5 | 3 2<br>4 3 | 2 3<br>3 5 | 4 1<br>7 2 | |
| 6 | 1 5<br>0 1 | | | | 5 1<br>4 1 | | 1 5<br>1 6 | | | |
| 7 | 1 6<br>0 1 | 4 3<br>1 1 | 5 2<br>2 1 | 2 5<br>1 3 | 3 4<br>2 3 | 6 1<br>5 1 | | 1 6<br>1 7 | 4 3<br>5 4 | 5 2<br>7 3 |
| 8 | 1 7<br>0 1 | | 3 5<br>1 2 | | 5 3<br>3 2 | | 7 1<br>6 1 | | 1 7<br>1 8 | |
| 9 | 1 8<br>0 1 | 5 4<br>1 1 | | 7 2<br>3 1 | 2 7<br>1 4 | | 4 5<br>3 4 | 8 1<br>7 1 | | 1 8<br>1 9 |
| 10 | 1 9<br>0 1 | | 7 3<br>2 1 | | | | 3 7<br>2 5 | | 9 1<br>8 1 | |

TABLE 3.2

The products of matrices $\alpha$ and $\beta$ for each entry in table 3.1.

| | b | | | | | | | | | |
|---|---|---|---|---|---|---|---|---|---|---|
| | 1 | 2 | 3 | 4 | 5 | 6 | 7 | 8 | 9 | 10 |
| a | | | | | | | | | | |
| 1 | $\alpha^0 = \beta^0$ | $\beta^1$ | $\beta^2$ | $\beta^3$ | $\beta^4$ | $\beta^5$ | $\beta^6$ | $\beta^7$ | $\beta^8$ | $\beta^9$ |
| 2 | $\alpha^1$ | | $\beta\alpha$ | | $\beta^2\alpha$ | | $\beta^3\alpha$ | | $\beta^4\alpha$ | |
| 3 | $\alpha^2$ | $\alpha\beta$ | | $\beta\alpha^2$ | $\beta\alpha\beta$ | | $\beta^2\alpha^2$ | $\beta^2\alpha\beta$ | | $\beta^3\alpha^2$ |
| 4 | $\alpha^3$ | | $\alpha\beta^2$ | | $\beta\alpha^3$ | | $\alpha\beta^2$ | | $\beta^2\alpha^3$ | |
| 5 | $\alpha^4$ | $\alpha^2\beta$ | $\alpha\beta\alpha$ | $\alpha\beta^3$ | | $\beta\alpha^4$ | $\beta\alpha^2\beta$ | $\beta\alpha\beta\alpha$ | $\beta\alpha\beta^3$ | |
| 6 | $\alpha^5$ | | | | $\alpha\beta^4$ | | $\beta\alpha^5$ | | | |
| 7 | $\alpha^6$ | $\alpha^3\beta$ | $\alpha^2\beta^2$ | $\alpha\beta\alpha^2$ | $\alpha\beta^2\alpha$ | $\alpha\beta^5$ | | $\beta\alpha^6$ | $\beta\alpha^3\beta$ | $\beta\alpha^2\beta^2$ |
| 8 | $\alpha^7$ | | $\alpha^2\beta\alpha$ | | $\alpha\beta\alpha\beta$ | | $\alpha\beta^6$ | | $\beta\alpha^7$ | |
| 9 | $\alpha^8$ | $\alpha^4\beta$ | | $\alpha^2\beta^3$ | $\alpha\beta\alpha^3$ | | $\alpha\beta^3\alpha$ | $\alpha\beta^7$ | | $\beta\alpha^8$ |
| 10 | $\alpha^9$ | | $\alpha^3\beta^2$ | | | | $\alpha\beta^2\alpha^2$ | | $\alpha\beta^8$ | |

Definition: For x an arbitrary n-square matrix denote by $x^G$ the matrix $kx^Tk$ where k is the n-square matrix with each entry he minor diagonal set to 1 and 0 elsewhere.

For n=2

$$k = \begin{bmatrix} 0 & 1 \\ 1 & 0 \end{bmatrix},$$

k has the properties $k^2=I$ and $k^T=k$.

For x,y arbitrary square matrices of equal order $$\begin{aligned}(xy)^G &= k(xy)^Tk \\ &= ky^Tx^Tk \\ &= ky^Tkkx^Tk \\ &= y^Gx^G.\end{aligned}$$

In the present case $\alpha^G=\alpha$ and $\beta^G=\beta$ hence $(\alpha\beta)^G=\beta\alpha$ and $(\beta\alpha)^G=\alpha\beta$, consequently this operation on an arbitrary finite product of n terms $x_1x_2 \ldots x_i \ldots x_n$, $x_i=\alpha$ or $x_i=\beta$ can be seen to provide the result of the product taken in the reverse order $x_n, x_{n-1} \ldots x_i \ldots x_1$ as follows $$\begin{aligned}(x_1 \ldots x_n)^G &= ((x_1 \ldots x_{n-1})(x_n))^G \\ &= x_n(x_1 \ldots x_{n-1})^G \\ &= x_nx_{n-1}(x_1 \ldots x_{n-2})^G \\ &\phantom{=} \ldots \\ &\phantom{=} \ldots \\ &= x_nx_{n-1} \ldots x_1.\end{aligned}$$

For example it can be checked by calculation or from the tables that $$\alpha^2\beta\alpha = \begin{bmatrix} 3 & 5 \\ 1 & 2 \end{bmatrix}, \begin{bmatrix} 3 & 5 \\ 1 & 2 \end{bmatrix}^G = \begin{bmatrix} 2 & 5 \\ 1 & 3 \end{bmatrix} = \alpha\beta\alpha^2$$

Equivalently $$0010 \mapsto \begin{bmatrix} 3 & 5 \\ 1 & 2 \end{bmatrix}, 0100 \mapsto \begin{bmatrix} 2 & 5 \\ 1 & 3 \end{bmatrix}$$

the anti encoding of 0010. From this relation it readily follows that $r((q(a,b))^G)=[a]_{a+b}^{-1}, [b]_{a+b}^{-1}$. So for example the binary sequence associated with the rational number 8/3 is the binary sequence, in reverse order, associated with the rational number 7/4. The term arithmetic inverse of a rational number is proposed for this operation which can be defined in $Q^+$ by $[a/b]^{-1}=[a]_{a+b}^{-1}/[b]_{a+b}^{-1}$.

When a matrix X in $M_2$ has the property $X^G=X$ the associated binary sequence must be a palindrome and in the rationals $[a/b]^{-1}=a/b$ will hold. When $[a/b]^{-1}=b/a$ then the associated binary sequence will have the property that taking its compliment yields the sequence in reverse order. Transposing $X \in M_2$ gives the matrix for the compliment in reverse order. Examples of these and other relationships necessarily implied can be found in the tables above.

The progress of an encoding can be conveniently displayed by diagrams such as

```
1        1        3        5        5        12
 -0→      -1→      -1→      -0→      -1→
1        2        2        2        7        7
``` which displays the encoding e((1,1), 01101) with the transforms similarly displayed as (a, b)  -0→  (a, a + b)
(a, b)  -1→  (a + b, b)

Which are arbitrarily selected for the standard encoding. The behaviour of some 'non standard' encodings is illustrated this way below.

(a, b)  -0→  (a + b, a)
(a, b)  -1→  (b, a + b)

```
1        2        3        f_{n+1}
 -0→      -0→      -0→     ...
1        1        2        f_n 1        1        2        f_n
 -1→      -1→      -1→     ...
1        2        3        f_{n+1}

1        2        1        4        1        n + 1
 -0→      -1→      -0→     ...  1→       -0→
1        1        3        1        n        1
```

$f_n, f_{n+1}$ successive Fibonacci numbers.

(a, b)  -0→  (a + b, a)
(a, b)  -1→  (a, a + b)

```
1        2        3        f_{n+1}
 -0→      -0→      -0→     ...
1        1        2        f_n 1        1        1        1
 -1→      -1→      -1→     ...
1        2        3        n 1        2        2        5        5
 -0→      -1→      -0→      -1→     ...
1        1        3        2        7

1        1        3        3        8
 -1→      -0→      -1→      -0→     ...
1        2        2        5        3
```

(a, b)  -0→  (a + b, a)
(a, b)  -1→  (a + b, b)

```
1        2        3        f_{n+1}
 -0→      -0→      -0→     ...
1        1        2        f_n 1        2        3        n
 -1→      -1→      -1→     ...
1        1        1        1

1        2        3        4
 -0→      -1→      -0→     ...
1        1        1        3
```

(a, b)  -0→  (a + b, a)
(a, b)  -1→  (a + b, b)

-continued

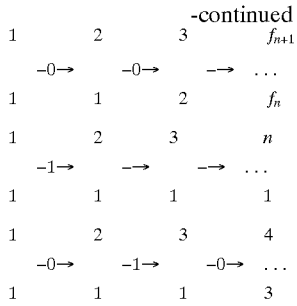

does not discriminate between initial bits. However encoding from 2/1 is without ambiguity. Decoding is achieved with the test 'if a/b>2 emit 0 else emit 1'.

The Symmetrical pair, (a, b) —0→ (a, a + b)
(a, b) —1→ (b, a + b)

have, mutatis mutandis, the same properties. The two pairs can be combined in an algorithm which yields the arithmetic inverse of the standard encoding as follows:

If the first bit is zero encode using the pair (a, b) —0→ (a, a + b)
(a, b) —1→ (b, a + b), encode from 1, 2.

If the first bit is one encode using the pair (a, b) —0→ (a + b, a)
(a, b) —1→ (a + b, b), encode from 2, 1.

Take the first derivative of the input sequence as the sequence to be encoded.

Example 01101 has the first derivative 1011.

The first bit of the original sequence is zero so the encoding proceeds

```
1       2       2       5       7
 -1→    -0→    -1→    -1→
2       3       5       7       12.
```

Compare with the standard encoding

```
1       1       3       5       5       12
 -0→    -1→    -0→    -0→    -0→
1       2       2       2       7       7.
```

The following algorithm outputs a pair a,b which decodes in the input order, without explicitly developing a 2×2 matrix.

Step 1. Set s=0 if first symbol is "0"
   else s="1"
Step 2. Initialise six variables
   a=1, b=2, u=0, v=1, x=1, y=1
Step 3. If next input=last input then
   a=a+u
   b=b+v
   Else
   Set u=x, v=y, x=a, y=b.
   Set a=a+u
   Set b=b+v
Step 4. If last input then if s=1 swap the values of a and b.

Emit a and b.
If not last input accept next
Goto Step 3.

The function q can be used to explicate consideration of the decomposition of rationals into partial fractions. The relationship with decomposition into distinct egyptian (unit) fractions is immediate since in order that such a process terminates the final step is a subtraction of the form a/c−b/d constrained by the requirement that ad−bc=1.

This procedure generalises to enable encoding sequences over k different symbols as follows:

Step 1. Assign to each of the k symbols a distinct integer in the range 0 to k−1. For example over 7 symbols 1,0,6,5,3,1,2 would be a possible sequence.

Assign to the sequence a pair of integers $$a = \sum_{j=1}^{n} c_j k^u$$

where $$u = \left(\sum_{j=1}^{n} c_i i\right) - c_j j$$

$$v = \sum_{i=1}^{n} c_i i$$

a and b divided by (a,b).

This expression is equivalent to forming the sums of the form $c_1/k^1 + c_2/k^2 \ldots c_n/k_n$.

For example the sequence 1,2,0,5,3 with k=6 of length n=5 is assigned the partial fraction $$1/6 + 2/6^2 + 0/6^3 + 5/6^4 + 3/6^5 = 1/6 + 2/6^2 + 5/6^4 + 3/6^5 = \frac{587}{2592}$$

The rational number is "decoded" as follows

Step 1. Accept a,b
   Set n=1
Step 2. Set m=k−1
Step 3. If m/kn is less than or equal to the rational number a/b then
   Emit m
   Set n=n+1
   Goto Step 2
   Else if m>1
   Set m=m−1, repeat Step 3
   Else if m=1
   Emit 0
   Set n=n+1
   If n=string length then end
   Else goto Step 2.

SECTION IV

In this section the relationship between finite presentation and numerical representation is examined. Existing techniques for representing operations on free words include the graph theoretic semigroup diagrams defined as follows:

Definition. A semigroup diagram is a planar connected digraph $\Gamma$ embedded in $\mathbf{R}^2$, labelled by a function which assigns to each oriented edge of $\Gamma$ an element of $F_X$.

(i) Each component of $S^2\Gamma = (\mathbf{R}^2 \cup \infty) - \Gamma$ is two-sided, meaning that it is bounded by a clockwise cycle of the form $\alpha\beta^{-1}$, where $\alpha$ and $\beta$ are non-empty paths (that is, paths which traverse edges only in the direction of their orientation; $\beta^{-1}$ denotes the reverse of $\beta$).

(ii) Γ has exactly one source, 0, and one sink I, each of which lies on the unbounded component of $S^2-\Gamma$.

If M is a diagram with underlying graph Γ, then the bounded components of $S^2-\Gamma$ are the regions of M. The number of regions of M is denoted by |M|. If D is a region of M with clockwise boundary cycle $\alpha\beta^{-1}$ as in (i) above, then $\alpha[\beta]$ is called the left [right] boundary of D. The labelling function φ extends to a function of non-empty directed paths and takes values in the free semigroup $F_X$. The left and right boundary labels of α and β are then r=φ(α) and s=φ(β) respectively, that is δD, the boundary of D, has label $rs^{-1}$.

A similar terminology applies to the whole diagram M. If D is the unbounded region of $S^2-\Gamma$, and $\alpha\beta^{-1}$ is a clockwise boundary cycle of D as in (i) above, then $\beta\alpha^{-1}$ is a clockwise boundary cycle of $S^2$-intD. Refer to $\beta[\alpha]$ as the left [right] boundary of M. Also, φ(β)[φ(α)] is the left [right] boundary label of M. The source 0 of a semigroup diagram is unique, and is the unique transmitter of the diagram; dually, the unique sink is its unique receiver.

Let S be a semigroup with presentation (X;R) where, without loss, assume that R is symmetric. A diagram M over (X:R) is one in which each interior region has left boundary label r and right boundary label s, where {r,s}ϵR; M is a (u,v)-diagram for the pair (u,v), where u and v are the left and right boundary labels of M respectively. M is also termed a derivation diagram over (X;R) for the pair (u,v) and extended as the (u,v)-diagram for any sequence of elementary R-transitions $u \equiv u_0 \to u_1 \to \ldots \to u_n \equiv v (u,v \in F_X)$. Here is used u≡v if u and v represent the same member of $F_X$ and write u=v if u and v are equal in S.

When functions are defined on sets for which they are automorphisms the existence of unique inverses allows for the representation of finitely presented semigroups.

EXAMPLE 4.1

For the semigroup (a,b,c,d;ab=c) the derivation diagram for $acbab=a^2b^2c$ by $acbab=a^2b^2ab=a^2b^2c$ can be displayed as below

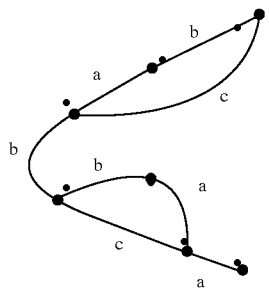

Relations can be treated as the (optional) insertion of the inverse of one side of an identity followed by the equivalent composition with the other. The derivation exploiting inverses becomes $ac(c^{-1}ab)bab(b^{-1}a^{-1}c)=aabbc$.

The left [right] graph LG(X;R)[RG(X;R)] associated with the presentation (X;R) has vertex set X and edge set R. A defining relation {r,s} joins the initial [terminal] letters of r and s. Loops and parallel edges may occur in either graph.

EXAMPLE 4.1

The left and right graphs of the presentation S=<a,b,c,d; abd=dba, adb=cad, aba=$ad^2$, bab=c, cab=acb> are respectively:

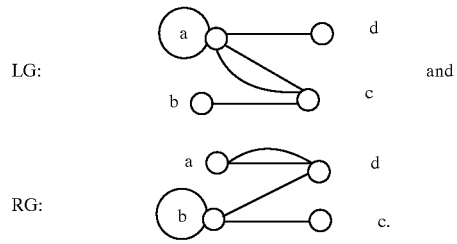

A walk of length m≧0 in an undirected graph is determined by a sequence of vertices $a_0, a_1 \ldots a_m$ and edges $e_1, \ldots e_m$ such that $e_i$ runs between $a_{i-1}$ and $a_i$ (i=1, ..., m). The walk is closed if $a_0=a_m$ and is a cycle if it is a closed trail, m≧1; and the vertices $a_1, \ldots, a_m$ are all different. (In particular, any loop is a cycle.) Walks and cycles LG(X,R) are called left walks and left cycles respectively for (X;R). The pair (X;R) is cycle-free if (X;R) has no left and no right cycles.

Define the mapping $\tau_n:[n]\times[n]\to E_{ij}$ of the integer pairs (i,j), 0≦i, j≦n−1 into the elementary matrices of order n by taking τ(i,j) to be the n-square matrix with the entries of the major diagonal set to 1 and the i,j$^{th}$ entry set to 1. If i=j the map is to the identity matrix of order n. The range of τ is the elementary matrices $E_n$ of order n which act on an arbitrary n×m matrix so that $E_{ij}$ X, i≠j, is derived from X by adding the j$^{th}$ row to the i$^{th}$ row. Products in $E_n$, $E_{ij}E_{kl}$ commute if and only if j≠k or i≠l. This fact suggests a strategy for developing sets of generators that are non commutative. Consider the set of n matrices $A_n$ in which $A_{i,n}$ is defined by $$A_i = \prod_{j=1}^{n} E_{i,j}.$$

Products in $A_n$ such as $A_iA_j$ inevitably involve a product $E_{ij}E_{jk}$ as $E_{ij}$ is a factor of $A_i$ and $E_{jk}$ is a factor of $A_j$ and as the factors of $A_i$ commute among themselves as do the factors of $A_j$, $A_i$ can be written with $E_{ij}$ to the right and $A_j$ can be written with an $E_{jk}$ to the left.

In the product tables below for n=2,3,4 and 5 commuting pairs are indicated by 0 and noncommuting pairs by 1.

| n = 2 | 1,2 | 2,1 |
|---|---|---|
| 1,2 | 0 | 1 |
| 2,1 | 1 | 0 |

| n = 3 | 1,2 | 1,3 | 2,1 | 2,3 | 3,1 | 3,2 |
|---|---|---|---|---|---|---|

-continued

| | | | | | | |
|---|---|---|---|---|---|---|
| 1,2 | 0 | 0 | 1 | 1 | 1 | 0 |
| 1,3 | 0 | 0 | 1 | 0 | 1 | 1 |
| 2,1 | 1 | 1 | 0 | 0 | 0 | 1 |
| 2,3 | 1 | 0 | 0 | 0 | 1 | 1 |
| 3,1 | 1 | 1 | 0 | 1 | 0 | 0 |
| 3,2 | 0 | 1 | 1 | 1 | 0 | 0 | n = 4

| | 1,2 | 1,3 | 1,4 | 2,1 | 2,3 | 2,4 | 3,1 | 3,2 | 3,4 | 4,1 | 4,2 | 4,3 |
|---|---|---|---|---|---|---|---|---|---|---|---|---|
| 1,2 | 0 | 0 | 0 | 1 | 1 | 1 | 1 | 0 | 0 | 1 | 0 | 0 |
| 1,3 | 0 | 0 | 0 | 1 | 0 | 0 | 1 | 1 | 1 | 1 | 0 | 0 |
| 1,4 | 0 | 0 | 0 | 1 | 0 | 0 | 1 | 0 | 0 | 1 | 1 | 1 |
| 2,1 | 1 | 1 | 1 | 0 | 0 | 0 | 0 | 1 | 0 | 0 | 1 | 0 |
| 2,3 | 1 | 0 | 0 | 0 | 0 | 0 | 1 | 1 | 1 | 0 | 1 | 0 |
| 2,4 | 1 | 0 | 0 | 0 | 0 | 0 | 1 | 0 | 1 | 1 | 1 | 1 |
| 3,1 | 1 | 1 | 1 | 0 | 1 | 0 | 0 | 0 | 0 | 0 | 0 | 1 |
| 3,2 | 0 | 1 | 0 | 1 | 1 | 1 | 0 | 0 | 0 | 0 | 0 | 1 |
| 3,4 | 0 | 1 | 0 | 0 | 1 | 0 | 0 | 0 | 1 | 1 | 1 |
| 4,1 | 1 | 1 | 1 | 0 | 0 | 1 | 0 | 0 | 1 | 0 | 0 | 0 |
| 4,2 | 0 | 0 | 1 | 1 | 1 | 1 | 0 | 1 | 0 | 0 | 0 | 0 |
| 4,3 | 0 | 0 | 1 | 0 | 0 | 1 | 1 | 1 | 1 | 0 | 0 | 0 | n = 5

| | 12 | 13 | 14 | 15 | 21 | 23 | 24 | 25 | 31 | 32 | 34 | 35 | 41 | 42 | 43 | 45 | 51 | 52 | 53 | 54 |
|---|---|---|---|---|---|---|---|---|---|---|---|---|---|---|---|---|---|---|---|---|
| 12 | 0 | 0 | 0 | 0 | 1 | 1 | 1 | 1 | 1 | 0 | 0 | 0 | 1 | 0 | 0 | 0 | 1 | 0 | 0 | 0 |
| 13 | 0 | 0 | 0 | 0 | 1 | 0 | 0 | 0 | 1 | 1 | 1 | 1 | 1 | 0 | 0 | 0 | 1 | 0 | 0 | 0 |
| 14 | 0 | 0 | 0 | 0 | 1 | 0 | 0 | 0 | 1 | 0 | 0 | 0 | 1 | 1 | 1 | 1 | 1 | 0 | 0 | 0 |
| 15 | 0 | 0 | 0 | 0 | 1 | 0 | 0 | 0 | 1 | 0 | 0 | 0 | 1 | 0 | 0 | 0 | 1 | 1 | 1 | 1 |
| 21 | 1 | 1 | 1 | 1 | 0 | 0 | 0 | 0 | 0 | 1 | 0 | 0 | 0 | 1 | 0 | 0 | 0 | 1 | 0 | 0 |
| 23 | 1 | 0 | 0 | 0 | 0 | 0 | 0 | 0 | 1 | 1 | 1 | 1 | 0 | 1 | 0 | 0 | 0 | 1 | 0 | 0 |
| 24 | 1 | 0 | 0 | 0 | 0 | 0 | 0 | 0 | 1 | 0 | 0 | 0 | 1 | 1 | 1 | 1 | 0 | 1 | 0 | 0 |
| 25 | 1 | 0 | 0 | 0 | 0 | 0 | 0 | 0 | 1 | 0 | 0 | 0 | 1 | 0 | 0 | 1 | 1 | 1 | 1 |
| 31 | 1 | 1 | 1 | 1 | 0 | 1 | 0 | 0 | 0 | 0 | 0 | 0 | 0 | 0 | 1 | 0 | 0 | 0 | 1 | 0 |
| 32 | 0 | 1 | 0 | 0 | 1 | 1 | 1 | 1 | 0 | 0 | 0 | 0 | 0 | 0 | 1 | 0 | 0 | 0 | 1 | 0 |
| 34 | 0 | 1 | 0 | 0 | 1 | 0 | 0 | 0 | 0 | 0 | 0 | 0 | 1 | 1 | 1 | 1 | 0 | 0 | 1 | 0 |
| 35 | 0 | 1 | 0 | 0 | 1 | 0 | 0 | 0 | 0 | 0 | 0 | 0 | 1 | 0 | 1 | 0 | 1 | 1 | 1 | 1 |
| 41 | 1 | 1 | 1 | 1 | 0 | 0 | 1 | 0 | 0 | 0 | 1 | 0 | 0 | 0 | 0 | 0 | 0 | 0 | 0 | 1 |
| 42 | 0 | 0 | 1 | 0 | 1 | 1 | 1 | 1 | 0 | 0 | 1 | 0 | 0 | 0 | 0 | 0 | 0 | 0 | 0 | 1 |
| 43 | 0 | 0 | 1 | 0 | 0 | 0 | 1 | 0 | 1 | 1 | 1 | 1 | 0 | 0 | 0 | 0 | 0 | 0 | 0 | 1 |
| 45 | 0 | 0 | 1 | 0 | 0 | 0 | 1 | 0 | 0 | 0 | 1 | 0 | 0 | 0 | 0 | 0 | 1 | 1 | 1 | 1 |
| 51 | 0 | 0 | 0 | 1 | 0 | 0 | 0 | 1 | 0 | 0 | 0 | 1 | 1 | 1 | 1 | 1 | 0 | 0 | 0 | 0 |

SECTION V

Consider $\mu:(F_X)^n \to M(P^+)$, $M(P^+)$ the collection of (finite) multisets over sets of nonzero positive real numbers.

Variables $q_i$ corresponding to states can be replaced by a finite collection of variables of any nonzero order provided only that both sup $q_i$ and inf $q_i$ are well defined. When variables are split in this way subvariables are initialised to some value and the variable d (which is not split) is set to be an element of $q_0$ determined by rule or table and the product $T(q_c,x_i)d$ is a product of d with an element of $T(q_c,x_i)$ determined by rule or table.

Let $\wp$ be the set of finite sets of real numbers and $\Delta$ a binary operation on $R$. Call a function a a selection function if $\sigma:P \to p$ with $P \in \wp$ and $p \in P$. Let $\sigma_1$ and $\sigma_2$ be selection functions.

For $P_i, P_j$ in $\wp$ the product of $P_i P_j$ is given $$P_i P_j = \{P_j \backslash (P_j)\sigma_2\} \cup \{(P_i)\sigma_1 \Delta (P_j)\sigma_2\}.$$

EXAMPLE 3.4

$P_1\{1,1,1,1\}$, $P_2=\{1,1,1\}$ $\sigma_1$ selects any element equal to supP. $\sigma_2$ selects any element equal to infP.

$$a \Delta b = \begin{cases} a + b \text{ if } a \leq 1 \\ \text{else} \\ a + b - 1. \end{cases}$$

A numerical representation that can always be faithfully decoded is as follows.

If 0
    replace an infimum of A by the $\Delta$ product of a supremum of B and an infimum of A.

If 1
    replace an infimum of B by the sum of a supremum of A and an infimum of B.

eg. set $A=\{1,1,1,1\}$, $B=\{1,1,1\}$ a numerical representation for 10010 proceeds by:

| |
|---|
| ({1 1 1 1}, {1 1 1})1 |
| ({2 1 1 1}, {1 1 1})0 |
| ({2 1 1 1}, {2 1 1})0 |
| ({2 1 1 1}, {2 2 1})1 |
| ({2 3 1 1}, {2 2 1})0 |
| ({2 3 1 1}, {2 2 3}) |

Decoding proceeds by:

```
If supB ≧ supA
    Emit 0
        if supA > 1 set a supremum of B to supB − supA + 1 else to
        supB − supA
Else
    Emit 1
        set a supremum of A to supA − supB.
If supA = supB = 1 then end.
    ({2 3 1 1}, {2 2 3})0
    ({2 3 1 1}, {2 2 1})1
    ({2 1 1 1}, {2 2 1})0
    ({2 1 1 1}, {1 2 1})0
    ({2 1 1 1}, {1 1 1})1
    ({1 1 1 1}, {1 1 1})
    01001^R = 10010
```

This approach to a key is made with certain unsolvability results in mind. The aim, of course being to arrive at a situation where it could be claimed that to assert the existence of a successful attack would be to raise a logical impossibility.

Post's correspondence Problem involves two lists of equal length words over a fixed alphabet. The entries in each list have a corresponding order (index) fixed at the outset.

For example

| Index | LIST 1 | LIST 2 |
|-------|--------|--------|
| 1     | aa     | a      |
| 2     | ab     | bab    |
| 3     | ba     | b      |
| 4     | bb     | ab     |

The process studied is that of selecting finite sequences of indices to construct corresponding words from the two lists.

For example the sequence 1,4,4,3 yields aabbbbba from list 1 from list 2.

Lists of a pair are equivalent if there exists at least one finite sequence of indices such that corresponding words are equal.

The sequence 1,4,2 demonstrates equivalence in this case as it yields aabbab from both lists.

This example can be contrasted with the following instance of Post's correspondence problem

| Index | LIST 3 | LIST 4 |
|-------|--------|--------|
| 1     | ba     | bab    |
| 2     | abb    | bb     |
| 3     | bab    | abb    | for which it is easy to prove that no such sequence exists and conclude that the lists are not equivalent.

However in the general case the decision problem for Post's correspondence problem is known to be recursively unsolvable, which is to say that any procedure (algorithm) designed to determine whether lists are equivalent must yield false determinations or fail to terminate.

The Word Problem for Semigroups can also be stated as a decision problem about equivalence. In this case we are to examine a pair of sequences of symbols from a finite alphabet and a finite list of rules for altering such sequences. The rules take the general form of specifying subsequences that can be replaced by some other subsequence.

For example the pair (ab, bbb) can be read as "an occurrence of ab can be replaced by bbb and bbb by ab" so aaabbb can be transformed into aabbbbb then into aabbab.

The rules can involve a stronger condition which restricts the replacement of a subsequence to instances where it occurs bounded by other specified sequences.

For example (ba<u>bb</u>a, b<u>bbbb</u>ba) can be read as "ab can be replaced by bbb if it occurs with b immediately to the left, and ba immediately to the right."

Such rules are sometimes referred to as context sensitive.

Sequences are equivalent if one can be transformed into the other by a finite number of applications of a specified list of rules.

The word problem would have solvable status if there was a procedure which accepted arbitrary pairs of sequences and an arbitrary list of rules and gave as output a correct decision on the question of equivalence between the sequences under those rules. No such procedure can exist.

The concept of a key has here been translated to mean a collection of choices that arise in fully describing particular encoding and decoding algorithms from an infinite category. Nothing is exploited that is not novel to the class of algorithms described.

Choice can be made available with respect to the following.

1. The binary operations to be employed and
   1.1 parameters of each operation chosen.
2. The number of classes of variables.
3. The number of variables in each class and
   3.1 initial values of every variable in each class.
4. The length of the vector controlling the order in which variables within a class are employed. One vector per class and
   4.1 the content of each vector.
5. The order in which the components of the resulting representation are to be transmitted.

The example which follows should clarify these terms.

EXAMPLE 5.1

E 1. Assume that in a list of binary operations provided, the following segment occurs $$a \circ b = xa + yb$$

$$a \circ b = x(a + b) + y$$

$$a \circ b = xab$$

and some subset is selected.

E 1.1 The parameters x and y must now be set for this operation to be fully defined.

E 2. Selecting k classes implies that the source alphabet will be treated as a k-ary fixed length block code during encryption.

Say k is set at 3 and the source alphabet one of the DOS code pages. The decimal value for each character will now be treated as a string of ternary digits for the purpose of encryption.

Having set k=3, three classes of variables must be distinguished. Use $V_1$, $V_2$, $V_3$ for these classes.

E 3. Using $n(V_i)$ for the number of variables in the $i^{th}$ class, set $n(V_1)=12$, $n(V_2)=9$, $n(V_3)=14$, $n(V_i)>0$ is the only restriction and the choice for one class is independent of that for any other class.

E 3.1 The initial setting for each variable can be any real number within a range determined by the choice of binary operation. There is no requirement for the initial settings to be equal within or between classes.

E 4. The order in which variables in each class are employed is without restriction and independent of the choice for any other class. While it is possible to generate infinite nonperiodic sequences to govern this process it is central to this concept of a key to select a finite length at which a chosen sequence for a class of variables is repeated.

Using $O_i$ for a vector that specifies an order for variables in class $i^{th}$ and $L(O_i)$ for the length of that vector.

For example set $L(O_1)=55$
$L(O_2)=47$
$L(O_3)=60$ and

E 4.1 specify

| | |
|---|---|
| $O_1 = 1, 3, 7, 12, 7, 9, 9, 3, 2, 3, 2, 11, \ldots$ | 55 terms |
| $O_2 = 7, 6, 5, 3, 9, 8, 7, 1, \ldots$ | 47 terms |
| $O_3 = 6, 1, 9, 4, 6, 2, 9, 3, 3, 3, 14, \ldots$ | 60 terms |

E 5. The output from the algorithm specified will be a sequence of numerical vectors of length $\Sigma n(V_i)$, in this example $12+9+14=35$.

Now specify a vector T of length 35 the entries of which determine the particular variable to which the numerical components in each block of 35 must be assigned to achieve decoding.

Example choose T to begin $v_{1,3}, V_{2,5}, V_{3,7}, V_{2,7} \ldots$ 35 terms where $v_{i,j}$ is the $j^{th}$ variable in the $i^{th}$ class.

The combinatorial problem faced in an attack by exhaustive enumeration can now be calculated. It is assumed attack is made with the following already available.

a) Full knowledge of the class of formal systems and the detail of algorithms constructed from them
b) Full detail of the process by which keys are constructed
c) Some process involving inspection of transmission that can discover the length of the vector T.

Contribution to the combinatorics arise as follows.

1. Knowing the total number of variables gives no information about k, the number of classes or the number of variables in each class.

The number of possibilities is $$p(\Sigma n(v_i))$$

$p(x)$ being the number of partitions of x.

For the example $p(35)=14{,}883$

2. Recalling that $O_j$ is a vector that controls the order in which variables in the $i^{th}$ class are employed and $L(O_i)$ is its length there, is a contribution of $$\Pi[(\Sigma n(v_i)!)(n(v_i)^{L(O)-n(V)})]$$

from this source.

For this example the terms in the product are of the magnitude $i = 1$    $.2 \times 10^{55}$
$i = 2$    $6.6 \times 10^{41}$
$i = 3$    $4.5 \times 10^{63}$ and their product is of the magnitude $3.7 \times 10^{160}$.

3. The number of choices in determining the order of components of T is just $$(\Sigma n(v_i))!$$

For the example $$35! \approx 1.03 \times 10^{40}$$

In general the contribution from these sources is $$p(\Sigma n(v_i)((\Sigma n(v_i))!)(\Pi[(\Sigma n(v_i)!)(n(v_i)^{L(O)-n(V)})]$$

For the example the result of the order $$5.69 \times 10^{207}$$

(For reference $2^{64} \approx 1.84 \times 10^{19}$)

No attempt has been made to quantify contributions from other freedom in the construction of a key for the reasons that follow.

1. The choice of binary operation is from a list the contents of which may need to be assumed known for the purpose of analysis of attack. Even a list of several thousand would be, by comparison with the contributions above, relatively small on that assumption.

2. The choice in setting the parameters of the binary operation chosen and freedom available from setting initial values for variables is, theoretically at least, a choice of real numbers in some range and consequently, being not enumerable, defies discrete combinatorial analysis.

References

Goldburg, D. (1991). What every computer scientist should know about floating point arithmetic. *A C M Comput. Surv.,* 23, 1, 5–48.

Higgins, P. M. (1992). *Techniques of semigroup theory.* Oxford University Press.

Howson. A. G. (1972). *A Handbook of terms used in algebra and analysis.* Cambridge University Press.

Lallement, G. (1986). Some algorithms for semigroups and monoids presented by a single relation. *Semigroup Theory and Applications, Oberwolfach, Lecture Notes in Math.,* 1320, Springer-Verlag, pp. 176–82.

Masters, J. H. (1971). *Psychological Predictions From Recursive Function Theory.* Doctoral thesis. University of Sydney.

Motzkin, T. (1949) "The Euclidean algorithm," *Bulletin of the American Mathematical Society,* Vol. 55, pages 1142–1146.

Robinson, D. W. (1962). On the generalised inverse of an arbitrary linear transformation's *Amer. Math. Monthly* 69, 412–416.

Schein, B. M. (1963). On the theory of generalised groups. *Dokl. Akad. Nauk SSSR* 153, 296–9 (in Russian). Quoted by Higgins, P. M. 1992 at p15.

TABLE 3.1

The mapping q of relative prime pairs a, b to square matrices over $N^0$ of determinant 1 for a, b ≤ 10.

| a \ b | 1 | 2 | 3 | 4 | 5 | 6 | 7 | 8 | 9 | 10 |
|---|---|---|---|---|---|---|---|---|---|---|
| 1 | 1 0<br>0 1 | 1 0<br>1 1 | 1 0<br>2 1 | 1 0<br>3 1 | 1 0<br>4 1 | 1 0<br>5 1 | 1 0<br>6 1 | 1 0<br>7 1 | 1 0<br>8 1 | 1 0<br>9 1 |
| 2 | 1 1<br>0 1 |  | 1 1<br>1 2 |  | 1 1<br>2 3 |  | 1 1<br>3 4 |  | 1 1<br>4 5 |  |
| 3 | 1 2<br>0 1 | 2 1<br>1 1 |  | 1 2<br>1 3 | 2 1<br>3 2 |  | 1 2<br>2 5 | 2 1<br>5 3 |  | 1 2<br>3 7 |
| 4 | 1 3<br>0 1 |  | 3 1<br>2 1 |  | 1 3<br>1 4 |  | 3 1<br>5 2 |  | 1 3<br>2 7 |  |
| 5 | 1 4<br>0 1 | 3 2<br>1 1 | 2 3<br>1 2 | 4 1<br>3 1 |  | 1 4<br>1 5 | 3 2<br>4 3 | 2 3<br>3 5 | 4 1<br>7 2 |  |
| 6 | 1 5<br>0 1 |  |  |  | 5 1<br>4 1 |  | 1 5<br>1 6 |  |  |  |
| 7 | 1 6<br>0 1 | 4 3<br>1 1 | 5 2<br>2 1 | 2 5<br>1 3 | 3 4<br>2 3 | 6 1<br>5 1 |  | 1 6<br>1 7 | 4 3<br>5 4 | 5 2<br>7 3 |
| 8 | 1 7<br>0 1 |  | 3 5<br>1 2 |  | 5 3<br>3 2 |  | 7 1<br>6 1 |  | 1 7<br>1 8 |  |
| 9 | 1 8<br>0 1 | 5 4<br>1 1 |  | 7 2<br>3 1 | 2 7<br>1 4 |  | 4 5<br>3 4 | 8 1<br>7 1 |  | 1 8<br>1 9 |
| 10 | 1 9<br>0 1 |  | 7 3<br>2 1 |  |  |  | 3 7<br>2 5 |  | 9 1<br>8 1 |  |

TABLE 3.2

The products of matrices α and β for each entry in table 3.1.

| a \ b | 1 | 2 | 3 | 4 | 5 | 6 | 7 | 8 | 9 | 10 |
|---|---|---|---|---|---|---|---|---|---|---|
| 1 | $\alpha^0 = \beta^0$ | $\beta^1$ | $\beta^2$ | $\beta^3$ | $\beta^4$ | $\beta^5$ | $\beta^6$ | $\beta^7$ | $\beta^8$ | $\beta^9$ |
| 2 | $\alpha^1$ |  | $\beta\alpha$ |  | $\beta^2\alpha$ |  | $\beta^3\alpha$ |  | $\beta^4\alpha$ |  |
| 3 | $\alpha^2$ | $\alpha\beta$ |  | $\beta\alpha^2$ | $\beta\alpha\beta$ |  | $\beta^2\alpha^2$ | $\beta^2\alpha\beta$ |  | $\beta^3\alpha^2$ |
| 4 | $\alpha^3$ |  | $\alpha\beta^2$ |  | $\beta\alpha^3$ |  | $\beta\alpha\beta^2$ |  | $\beta^2\alpha^3$ |  |
| 5 | $\alpha^4$ | $\alpha^2\beta$ | $\alpha\beta\alpha$ | $\alpha\beta^3$ |  | $\beta\alpha^4$ | $\beta\alpha^2\beta$ | $\beta\alpha\beta\alpha$ | $\beta\alpha\beta^3$ |  |
| 6 | $\alpha^5$ |  |  |  | $\alpha\beta^4$ |  | $\beta\alpha^5$ |  |  |  |
| 7 | $\alpha^6$ | $\alpha^3\beta$ | $\alpha^2\beta^2$ | $\alpha\beta\alpha^2$ | $\alpha\beta^2\alpha$ | $\alpha\beta^5$ |  | $\beta\alpha^6$ | $\beta\alpha^3\beta$ | $\beta\alpha^2\beta^2$ |
| 8 | $\alpha^7$ |  | $\alpha^2\beta\alpha$ |  | $\alpha\beta\alpha\beta$ |  | $\alpha\beta^6$ |  | $\beta\alpha^7$ |  |
| 9 | $\alpha^8$ | $\alpha^4\beta$ |  | $\alpha^2\beta^3$ | $\alpha\beta\alpha^3$ |  | $\alpha\beta^3\alpha$ | $\alpha\beta^7$ |  | $\beta\alpha^8$ |
| 10 | $\alpha^9$ |  | $\alpha^3\beta^2$ |  |  |  | $\alpha\beta^2\alpha^2$ |  | $\alpha\beta^8$ |  |

I claim:

1. A method of generating a digitally encoded electric output signal representing a transformation of a digitally encoded electric input signal representing a sequence of numbers, said method comprising the steps of:
   (i) identifying each said number of said sequence represented in said input signal;
   (ii) coupling a first said number of said sequence with a predetermined commencement matrix, said coupling comprising the forward application of a reversible mathematical procedure, to form a forward resultant matrix;
   (iii) coupling each succeeding number of said sequence with the forward resultant matrix of the preceding step to form an augmented forward resultant matrix;
   (iv) carrying out step (iii) for each remaining number of said sequence in turn to form a final augmented forward resultant matrix; and
   (v) forming said output signal from the contents of said final augmented forward resultant matrix.

2. The method of claim 1, wherein the reversible mathematical procedure comprises a linear operator.

3. The method of claim 1, wherein the reversible mathematical forward procedure is selected from the set consisting of:
   (i) addition (subtraction) (ii) multiplication (division), and
   (iii) exponentiation (taking the logarithm),
   and the corresponding reverse procedure as set out in parentheses, and vice versa.

4. The method of claim 1, wherein the predetermined commencement matrix is selected from the group consisting of the unity matrix, and the product of the unity matrix and two.

5. A method of generating a digitally encoded output signal representing a reverse transformation to that claimed in claim 1 using as an input the output of the method of claim 1 in order to generate an output electric signal which is digitally encoded to represent said sequence of numbers, said method comprising the steps of:
   (i) identifying from the output signal of the method of claim 1, the contents of the final augmented forward resultant matrix;
   (ii) applying in the reverse direction the reversible mathematical procedure of claim 1 to the contents of said final augmented forward resultant matrix to emit a number and form a reverse resultant matrix;
   (iii) applying in the reverse direction said reversible mathematical procedure to the contents of said reverse resultant matrix to emit a number and form an augmented reverse resultant matrix;
   (iv) carrying out step (iii) for each remaining augmented reverse resultant matrix until the predetermined commencement matrix is generated; and
   (v) forming said output electric signal by representing said emitted numbers in the sequence of their emission.

6. The method of claim 5, wherein the reversible mathematical procedure comprises a linear operator.

7. The method of claim 5, wherein the reversible mathematical forward procedure is selected from the set consisting of:
   (i) addition (subtraction)
   (ii) multiplication (division), and
   (iii) exponentiation (taking the logarithm),
   and the corresponding reverse procedure as set out in parentheses, and vice versa.

8. The method of claim 5, wherein the predetermined commencement matrix is selected from the group consisting of the unity matrix, and the product of the unity matrix and two.

9. The method of claim 5, wherein the final augmented forward matrix is transposed to emit the sequence in the reverse transformation in the reverse order.

10. The method of claim 5, wherein the final augmented matrix is transformed by means of a Z transformation (as herein defined) and, if necessary, repeatedly Z transformed, to arrive at a single number which represents the original sequence of numbers.

11. The method of claim 10, wherein the sequence is recovered from the single number.

* * * * *